(12) United States Patent
Schulze et al.

(10) Patent No.: US 10,651,037 B2
(45) Date of Patent: May 12, 2020

(54) METHOD FOR FABRICATING A DOPED ZONE IN A SEMICONDUCTOR BODY

(75) Inventors: Hans-Joachim Schulze, Ottobrunn (DE); Anton Mauder, Kolbermoor (DE); Helmut Strack, München (DE); Holger Schulze, Villach (AT)

(73) Assignee: Infineon Technologies AG, Neubiberg (DE)

( * ) Notice: Subject to any disclaimer, the term of this patent is extended or adjusted under 35 U.S.C. 154(b) by 694 days.

(21) Appl. No.: 11/232,735

(22) Filed: Sep. 22, 2005

(65) Prior Publication Data

US 2006/0073684 A1  Apr. 6, 2006

(30) Foreign Application Priority Data

Sep. 22, 2004  (DE) .................. 10 2004 045 996

(51) Int. Cl.
*H01L 21/265* (2006.01)
*H01L 29/66* (2006.01)
(Continued)

(52) U.S. Cl.
CPC ...... *H01L 21/26506* (2013.01); *H01L 21/263* (2013.01); *H01L 21/26513* (2013.01);
(Continued)

(58) Field of Classification Search
CPC .......... H01L 29/66333–66348; H01L 29/66712–66734; H01L 21/26506;
(Continued)

(56) References Cited

U.S. PATENT DOCUMENTS 3,718,502 A * 2/1973 Gibbons ............. 438/536
3,982,967 A * 9/1976 Ku et al. ............. 438/357
(Continued)

FOREIGN PATENT DOCUMENTS

DE  220 812  4/1985
DE  40 35 842  5/1992
(Continued)

OTHER PUBLICATIONS

Wu, Shye-Lin, Chung-Len Lee, Tan Fu Lei, Hue-Chen Chang, "Characteristics of Polysilicon Contacted Shallow Junction Diode Formed with a Stacked-Amorphous-Silicon Film", IEEE Trans. Electron Devices, vol. ED-40, p. 1797, 1993.*
(Continued)

*Primary Examiner* — Daniel Luke
(74) *Attorney, Agent, or Firm* — Murphy, Bilak & Homiller, PLLC

(57) ABSTRACT

One embodiment of the invention relates to a method for fabricating a doped semiconductor zone in a semiconductor body. The method includes implanting dopant particles via one side into the semiconductor body or applying a layer containing dopant particles to one side of the semiconductor body. The method also includes irradiating the semiconductor body via the one side with further particles at least in the region containing the dopant particles. The method finally includes carrying out a thermal treatment by means of which the semiconductor body is heated, at least in the region containing the dopant particles, to a predetermined temperature in order to activate the implanted dopant particles, said temperature being less than 700° C.

12 Claims, 12 Drawing Sheets

(51) Int. Cl.
  *H01L 21/304* (2006.01)
  *H01L 29/10* (2006.01)
  *H01L 21/324* (2006.01)
  *H01L 21/263* (2006.01)
  *H01L 29/08* (2006.01)

(52) U.S. Cl.
  CPC .......... *H01L 21/304* (2013.01); *H01L 21/324* (2013.01); *H01L 29/0878* (2013.01); *H01L 29/1095* (2013.01); *H01L 29/66136* (2013.01); *H01L 29/66333* (2013.01); *H01L 29/66712* (2013.01); *H01L 29/66727* (2013.01); *H01L 29/66734* (2013.01); *H01L 21/2658* (2013.01)

(58) Field of Classification Search
  CPC ..... H01L 21/324; H01L 29/7801–7826; H01L 29/7395–7398; H01L 21/26513–2652; H01L 21/304; H01L 21/302–3088
  USPC .................................... 438/528; 257/E21.473
  See application file for complete search history.

(56) References Cited

U.S. PATENT DOCUMENTS

| | | | |
|---|---|---|---|
| 4,522,657 A * | 6/1985 | Rohatgi et al. ................. | 438/57 |
| 4,596,605 A * | 6/1986 | Nishizawa et al. ............. | 438/57 |
| 5,208,471 A * | 5/1993 | Mori .................. | H01L 29/1095 257/327 |
| 5,571,735 A * | 11/1996 | Mogami et al. ............. | 438/231 |
| 5,633,174 A * | 5/1997 | Li ................. | 438/475 |
| 5,943,601 A * | 8/1999 | Usui et al. .................... | 438/688 |
| 6,100,189 A * | 8/2000 | Hu et al. ...................... | 438/659 |
| 6,136,636 A * | 10/2000 | Wu ............................. | 438/231 |
| 6,583,018 B1 * | 6/2003 | Matsunaga et al. .......... | 438/373 |
| 6,610,572 B1 * | 8/2003 | Takei .................. | H01L 21/263 257/E21.383 |
| 6,632,728 B2 | 10/2003 | Gossmann et al. | |
| 6,693,011 B2 * | 2/2004 | Wahl .................. | H01L 29/7813 438/270 |
| 6,803,294 B2 * | 10/2004 | Kouno ............. | H01L 29/66333 257/E21.237 |
| 6,806,153 B2 | 10/2004 | Wieczorek et al. | |
| 2002/0192931 A1 * | 12/2002 | Hayakawa .................... | 438/528 |
| 2004/0023500 A1 * | 2/2004 | Dokumaci ........ | H01L 29/66545 438/694 |
| 2004/0072394 A1 * | 4/2004 | Noda ........................... | 438/528 |
| 2004/0080015 A1 * | 4/2004 | Mauder .............. | H01L 29/1604 257/500 |

FOREIGN PATENT DOCUMENTS

| | | |
|---|---|---|
| DE | 102 43 758 | 4/2004 |
| DE | 10260613 | 7/2004 |
| DO | 220 812 | 4/1985 |

OTHER PUBLICATIONS

Hava, S., B.M. Lacquet, P.L. Swart, "Hydrogen Implanted Silicon Oxidation", Journal of Electronic Materials, vol. 18, No. 5, p. 589, 1989.*

Baliga, Jayant B., "Power Semkonductor Devices," PWS Publishing, Chapter 8: Insulated Gate Bipolar Transistor, pp. 453-457, (1995).

Baliga, Jayant B., "Power Semiconductor Devices," PWS Publishing, Chapter 8: Insulated Gate Bipolar Transistor, pp. 453-457, (1995).

Silber, D. et al., "Improved Dynamic Properties of GTO-Thyristors and Diodes by Proton Implantation," IEEE, 6.6, 162-165, (1985).

Sze, "13.5 Implant Damage and Annealing, 13.5.1 Implant Damage" Semiconductor Devices, Physics and Technology, 2nd Edition, Chapter 13. Impurity Doping, pp. 477-480 (1985).

* cited by examiner

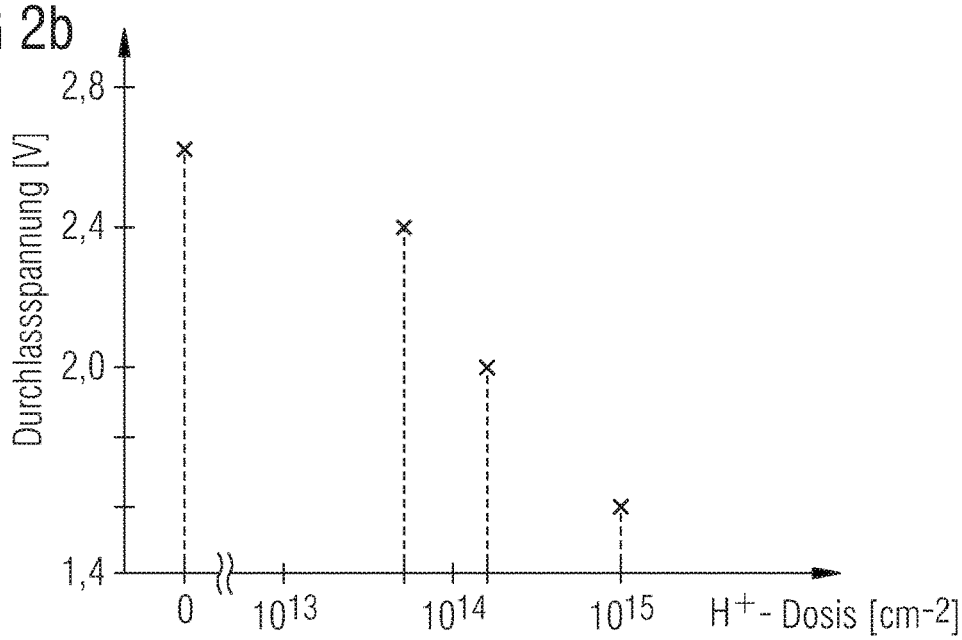
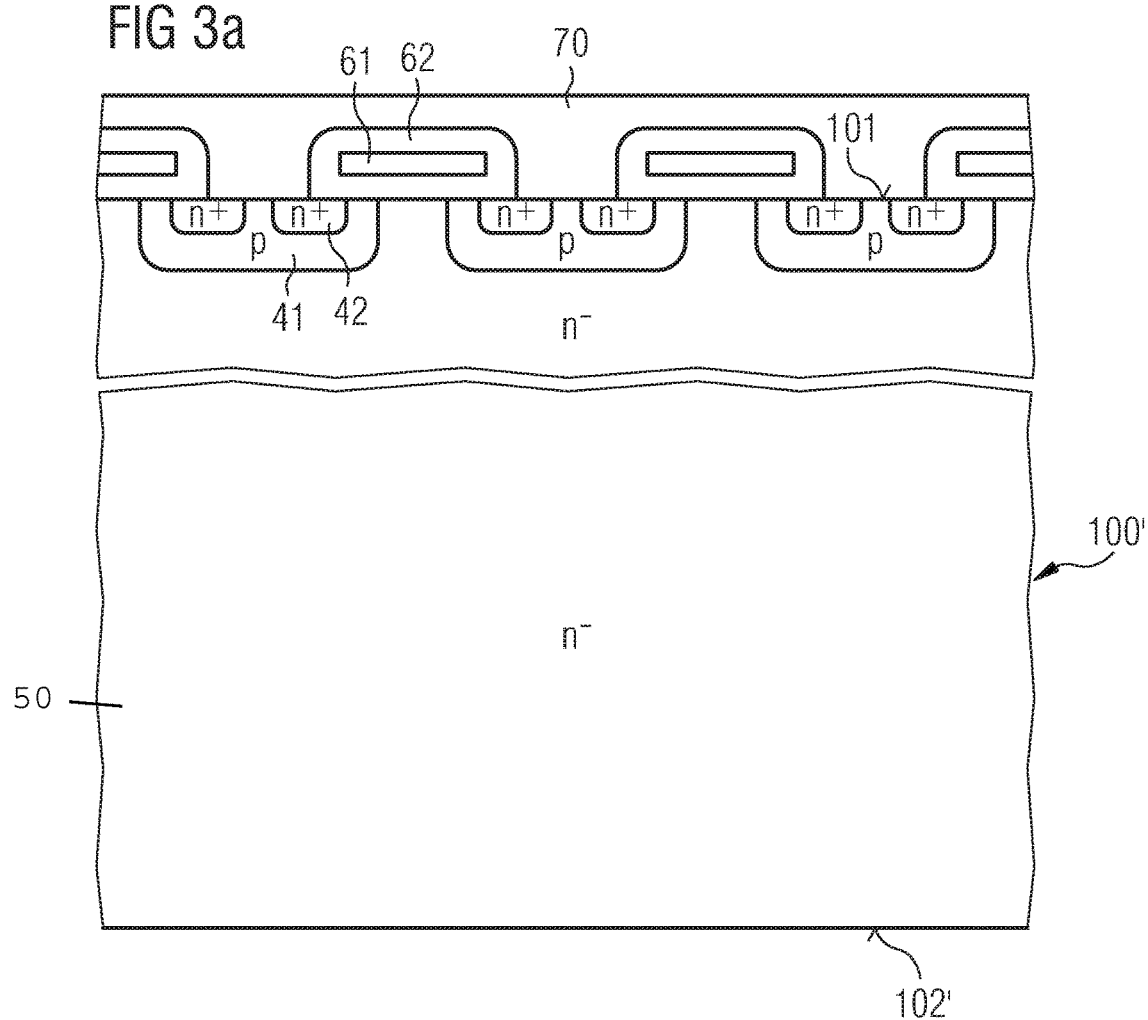

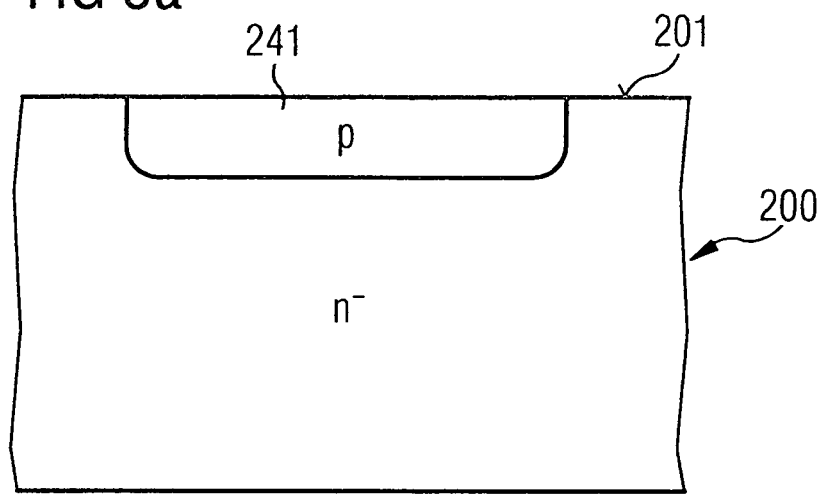
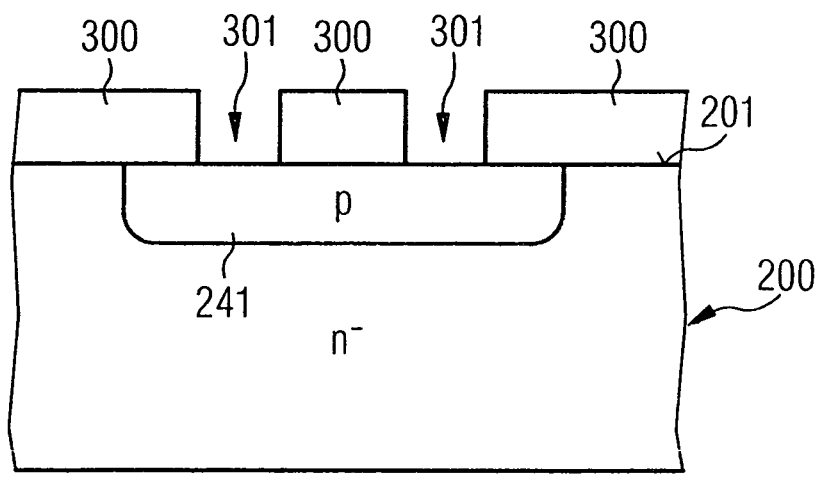

METHOD FOR FABRICATING A DOPED ZONE IN A SEMICONDUCTOR BODY

CROSS-REFERENCE TO RELATED APPLICATIONS

This Utility Patent Application claims priority to German Patent Application No. DE 10 2004 045 996.7, filed on Sep. 22, 2004, which is incorporated herein by reference.

BACKGROUND

One embodiment of the present invention relates to a method for fabricating a doped zone in a semiconductor body, and in one case for fabricating an emitter-forming zone near the surface or for fabricating a buried semiconductor zone.

Diffusion methods in which dopant atoms are indiffused into a semiconductor body and implantation methods are the commonest methods for fabricating a doped semiconductor zone in a semiconductor body or a semiconductor layer. In an implantation method, dopants are implanted into the semiconductor body by irradiating the semiconductor body with highly energetic dopant particles, for example phosphorus ions for fabricating an n-doped semiconductor zone or boron ions for fabricating a p-doped semiconductor zone. In order to activate these implanted dopant ions, that is to say to incorporate them at lattice sites of the crystal lattice of the semiconductor body, and in order to anneal crystal damage resulting from the irradiation, a thermal treatment of the semiconductor body is required after the particle implantation. This thermal treatment required subsequent to an ion implantation is described for example in Sze: "Semiconductor Devices, Physics and Technology", 2nd edition, ISBN 0-471-33372-7, pages 478 to 480.

Customary temperatures for activating implanted dopant atoms lie in the range of between 800° C. and 1100° C., and are thus so high that the method steps explained for fabricating a doped semiconductor zone have to be effected prior to the fabrication of metallic structures, for example for interconnects, or plastic structures, for example for passivations. The metals and plastics used in the fabrication of semiconductor components would otherwise melt, evaporate or decompose at such high temperatures, as a result of which the component structures fabricated from these materials would be destroyed.

The necessity of being able to fabricate metal structures and plastic structures only after the fabrication of doped semiconductor zones leads to difficulties in the case of components that are produced by means of a so-called thin-wafer technology, as is explained below.

In the case of vertical components, in which the current-carrying path runs in the vertical direction of the semiconductor body, that is to say perpendicularly to a front side and a rear side of the semiconductor body, in order to minimize the on-state and switching losses, it is endeavored to choose the dimensions of the semiconductor body in the vertical direction—that is to say the thickness of said semiconductor body—to be only as large as is necessary with regard to the desired dielectric strength of the component. For power semiconductor components such as, for example, power diodes, power thyristors, power MOSFETS or power IGBTs with a dielectric strength of 600 V, component thicknesses of approximately 60 µm are already sufficient in this case. Since wafers on which a multiplicity of identical components are produced simultaneously and from which the individual chips are sawn out later are difficult to handle with thicknesses of just 60 µm during individual fabrication processes, thicker wafers are usually used as starting material and are thinned by grinding and/or etching toward the end of the fabrication process. In this case, it is desirable, for stability reasons, to carry out as many method steps as possible before the semiconductor body is thinned.

The fabrication of a doped semiconductor zone near the surface, for example of an emitter, on the component side at which the wafer is thinned is in this case possible only after the wafer has been thinned. In this case, the high annealing temperatures required in conventional implantation methods entail the risk of the thinned wafer being damaged for example by the thermomechanical stress under the high thermal loading. What is more, the process steps for fabricating metallic conductor structures and passivation layers can only be carried out on the thinned wafer, which likewise entails the risk of the wafer being damaged or broken.

N-doped semiconductor zones can also be fabricated in a semiconductor body by proton implantation and a subsequent thermal step. This procedure is described for example in Silber et al.: "Improved Dynamic Properties of GTO-Thyristors and Diodes by Proton Implantation", Technical Digest in International Electron Device Meeting 1985, IEEE, pages 162-165 or in DE 102 43 758 A1. The temperatures for the thermal step, by means of which so-called hydrogen-induced donors are produced, may in this case lie in the range of between 350° C. and 450° C. However, highly doped semiconductor zones such as are required for emitters of power semiconductor components, for example, can scarcely be fabricated by means of such a proton implantation since, according to current knowledge, from the implanted protons only a few percent of the implanted dose lead to the formation of donors.

Moreover, there is a need for a method for fabricating semiconductor zones that are near the surface but buried, in order to improve the so-called "latch-up behavior" of power IGBTs or power MOSFETs. It is known from Baliga: "Power Semiconductor Devices", PWS publishing, 1995, ISBN 0-534,94098-6, pages 453 to 457, that the latch-up behavior of a power IGBT can be improved by producing, in the p-type body zone of the IGBT, a highly doped, if appropriate flat, semiconductor zone below the n-type emitter of the IGBT.

SUMMARY

One embodiment of the present invention to provides a method for fabricating a doped zone in a semiconductor body using an implantation step in which lower annealing temperatures are required.

The method according to one embodiment of the invention for fabricating a doped semiconductor zone in a semiconductor body includes:
implanting dopant particles via one side into the semiconductor body or applying a layer containing dopant particles to one side of the semiconductor body,
irradiating the semiconductor body via the one side with further particles at least in the region containing the dopant particles,
carrying out a thermal treatment by means of which the semiconductor body is heated, at least in the region containing the dopant particles, to a predetermined temperature in order to activate the implanted dopant particles, said temperature being less than 700° C.

In one case, protons, helium ions, argon ions, semiconductor ions or electrons are suitable as further particles for irradiating the semiconductor body.

In one embodiment after an irradiation of the semiconductor body with the further particles which is effected in addition to the implantation of the dopant particles, significantly lower temperatures suffice for activating the implanted dopant particles. Thus, when silicon is used as semiconductor material, annealing temperatures in the region of 400° C. already suffice to activate the implanted dopant particles. In one case, the degree of activation is dependent on the irradiation dose of the further particles and rises as the irradiation dose of said further particles increases.

Good doping results are obtained in one case if the implantation of the dopant particles and the irradiation of the semiconductor body with the further particles are effected in such a way that an implantation depth to which the dopant particles penetrate into the semiconductor body is less than a penetration depth of the further particles. This shows that the further particles cannot be the primary cause of the doping effect, rather that the irradiation with the further particles has a catalytic effect on the activation mechanism of the implanted dopant particles and thereby enables an activation at lower temperatures.

When protons are used as further particles, it is possible, moreover, to saturate so-called "dangling bonds" and damage to the semiconductor crystal, for example damage such as that produced by a preceding implantation with doping elements, by means of the protons or hydrogen atoms. Such defects act as recombination centers in the semiconductor crystal in an undesirable manner. The effectiveness of these defects as recombination centers is significantly reduced on account of the proton implantation, even in the case of amorphization of the crystal.

If, rather than protons, non-doping atoms, such as for example, helium atoms, silicon atoms, argon atoms etc., are used as further particles that promote the activation of the implanted dopant atoms, protons are in one case introduced into the semiconductor body in addition to these particles in order to reduce the explained effectiveness of defects as recombination centers. Said protons can be introduced into the semiconductor body not only by means of an implantation but also by means of a hydrogen plasma.

The dopant particles may be n-doping particles or p-doping particles irrespective of the type of additional particles used.

The method according to one embodiment of the invention is suitable for fabricating arbitrary doped semiconductor zones, in one case near the surface, in a semiconductor body and is suitable for fabricating highly doped emitter and contact zones of power semiconductor components. However, the method can also be used for the fabrication of highly doped layers with extremely small penetration depths in IC technology, since the high temperatures of RTA steps (RTA=Rapid Thermal Annealing) are not required when this method is employed. This avoids an undesired widening or outdiffusion of this highly doped layer as a result of an RTA step. The low activation temperatures in this case permit fabrication of metallic structures, for example of conductor structures, or of plastic structures, for example of polyimide structures, as passivation structures of the component, as early as before the fabrication of the doped semiconductor zones. This makes the method suitable for fabricating doped zones in the case of components in thin-wafer technology.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2b illustrates measurement results for the forward voltage of such a diode as a function of the irradiation dose of further particles implanted into the semiconductor body besides dopant particles.

FIGS. 3a-3c illustrate the fabrication of a rear side contact of a power MOSFET or a rear side emitter of a power IGBT using the method according to one embodiment of the invention.

FIGS. 5a-5d illustrate the fabrication of a doped semiconductor zone near the surface for a lateral transistor.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
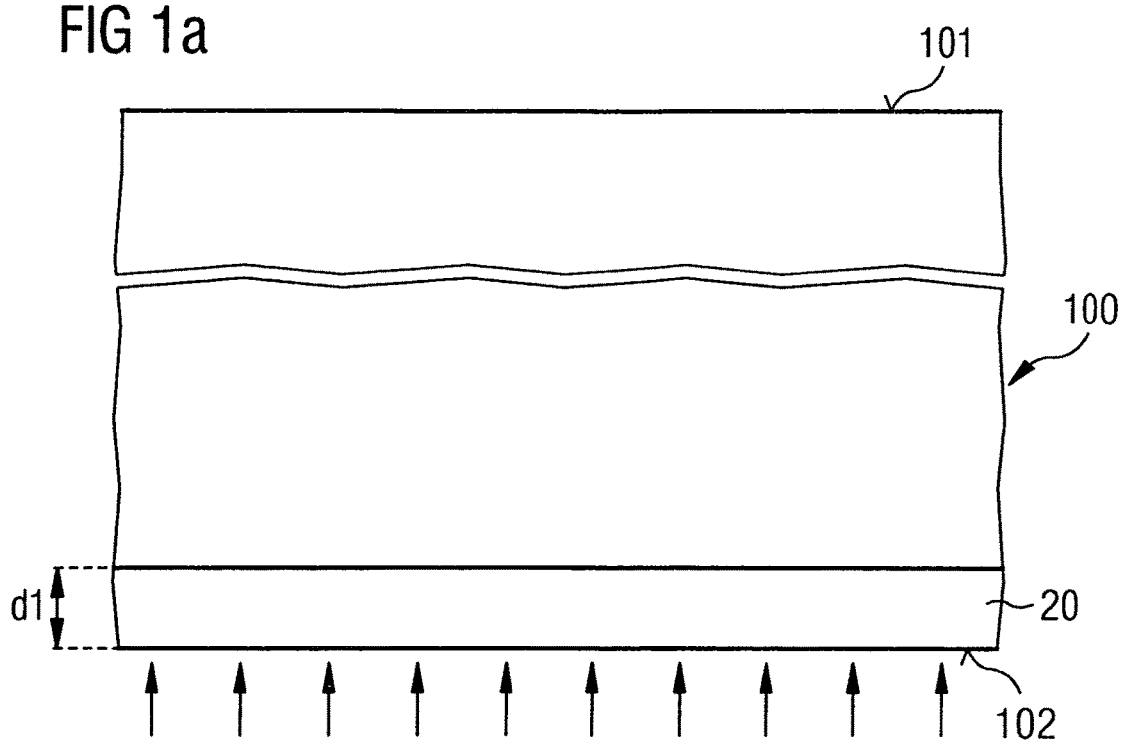
FIGS. 1a-1c illustrate the method according to one embodiment of the invention for fabricating a doped zone in a semiconductor body during different method steps.

The method according to one embodiment of the invention is explained below for the fabrication of a doped semiconductor zone near the surface in a semiconductor body 100. FIG. 1a illustrates this semiconductor body in a partial detail in cross section. In this case, the reference symbol 101 designates a first side, for example the front side, of said semiconductor body 100, while the reference symbol 102 designates a side opposite to the first side 101, for example the rear side 102 of the semiconductor body 100.

In a first method step illustrated in FIG. 1a, dopant particles are implanted via the side 102 into the semiconductor body 100. Depending on the desired doping type of the semiconductor zone fabricated by the method, said dopant particles are either n-doping particles, for example phosphorus ions, arsenic ions or antimony ions, or p-doping particles, for example boron or aluminum ions. In this case, the implantation energy chosen is chosen in a manner dependent on the desired dimensions of the doped zone fabricated and the distance of this zone proceeding from the side 102. In the example, the implantation energy is chosen such that the dopant particles are implanted into a region 20 near the surface, which subsequently results in a doped zone that reaches as far as the side 102. It goes without saying, however, that buried zones can also be produced by means of the method if the dopant particles are implanted correspondingly deep into the semiconductor body. The dimensions of the later doped semiconductor zone are all the larger, in the vertical direction of the semiconductor body 100, the higher the implantation energy. The implantation dose of the implanted dopant particles is chosen in a manner dependent on the desired doping concentration of the doped semiconductor zone to be fabricated.

Merely implanting the dopant particles into the region 20 near the surface does not yet lead to the desired electrical properties of the doping of the semiconductor body in said region 20, since first of all the implantation gives rise to lattice defects in the crystal lattice of the semiconductor body 100 which considerably influence the charge carrier mobility and the charge carrier lifetime, and since the implanted dopant particles are for the most part arranged interstitially, that is to say are situated at interstitial sites, while an electrical effectiveness of the doping requires the dopant particles to be incorporated at lattice sites of the semiconductor crystal lattice. The dimension of the region 20 into which dopant particles are implanted during this first method step is designated by d1 in FIG. 1a.

Figure 1B:
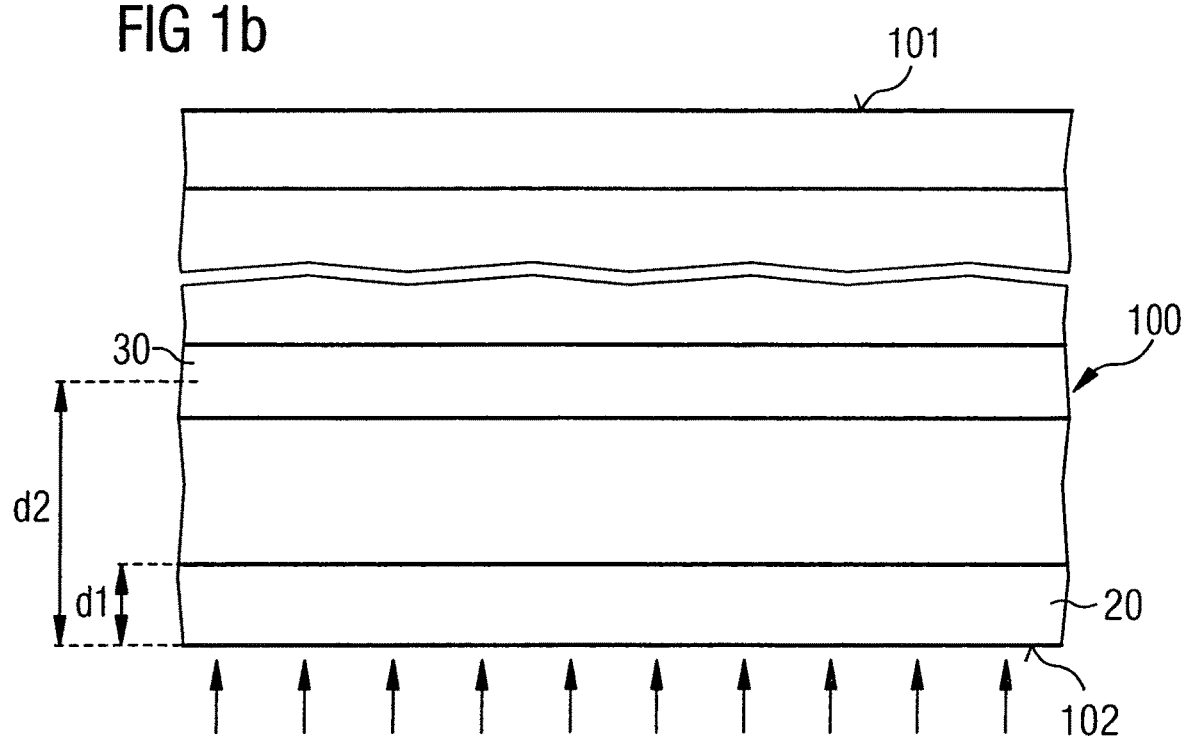

In a next method step illustrated in FIG. 1b, the semiconductor body 100 is irradiated with further particles via the implantation side 102 in order to implant said further particles into the semiconductor body 100. Said further particles are protons, for example, but may also be helium ions, argon ions, ions of the semiconductor material used for the semiconductor body 100, and of a different semiconductor material or else electrons. The irradiation energy or implantation energy for these further particles is in one case chosen such that the further particles penetrate more deeply into the semiconductor body proceeding from the side 102 than the dopant particles implanted during the first method step. The reference symbol 30 in FIG. 1b designates the so-called end-of-range region, that is to say the region into which the majority of the further particles introduced by means of the irradiation penetrate into the semiconductor body 100. The distance between the irradiation side 102 and the center of said end-of-range region 30 is designated by d2 in FIG. 1b. In this case, the position of said end-of-range region 30 is dependent on the irradiation energy or implantation energy, the distance d2 being all the larger, the greater said irradiation or implantation energy. In this case, the distance between the end-of-range region 30 and the implantation region 20 may be very small or even absent, in the latter case the end-of-range region lying within the implantation region 20.

The irradiation of the semiconductor body 100 with the further particles is followed by an annealing step or activation step, during which the semiconductor body 100 is heated to a predetermined activation temperature for a predetermined time duration of a few minutes up to a few hours at least in the region to be doped. Said activation temperature is less than 550° C. and in one case lies in the region of approximately 400° C.

Said activation temperature is essentially limited by the thermal stability of the materials used up to that point for fabricating the components, such as, for example, metalizations or polymeric insulation layers, which will be explained below.

Figure 1C:
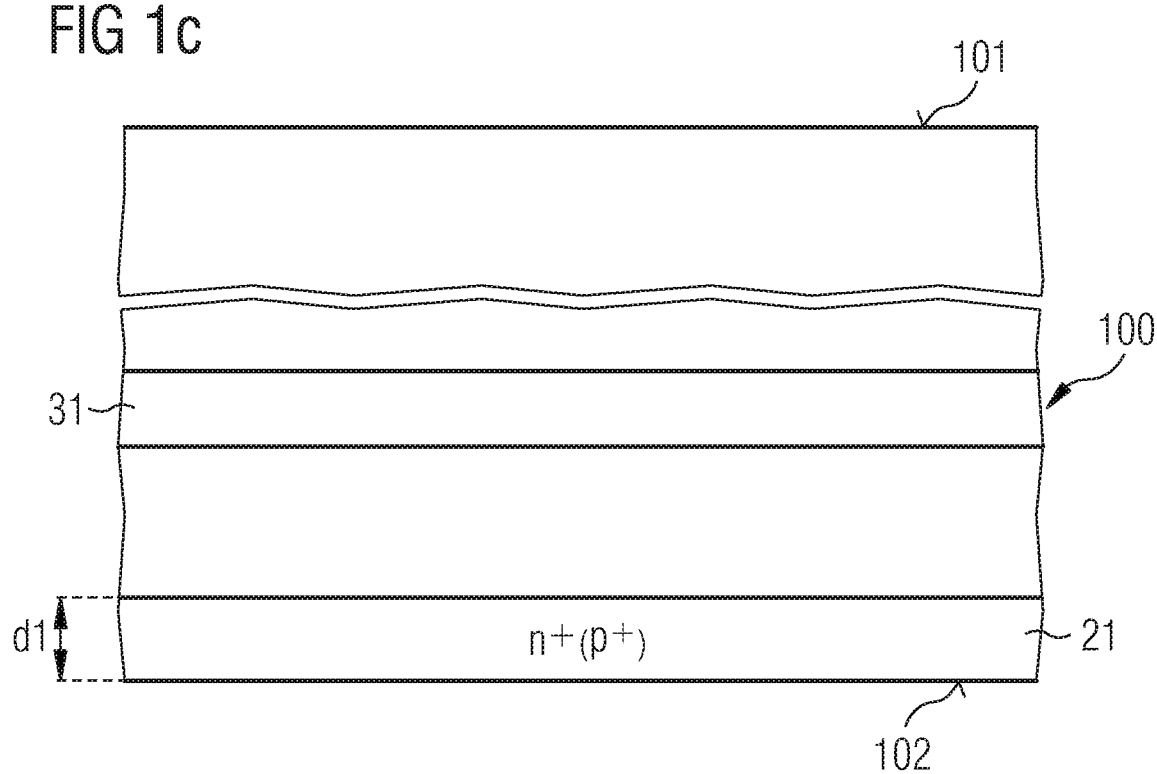

Referring to FIG. 1c, the result of this activation step is a doped, electrically active semiconductor zone 21, near the surface in the example, which is either n-doped or p-doped depending on the dopant particles implanted during the first method step. The dimension of this doped semiconductor zone 21 proceeding from the implantation side 102 essentially corresponds to the dimensions of the zone 20 (FIG. 1a) into which the dopant particles were implanted, since no appreciable indiffusion of the dopant particles into the semiconductor body 100 is effected on account of the low activation temperatures.

The effect of the activation step on the further particles introduced into the semiconductor 100 or on the semiconductor body in the end-of-range region 30 of this particle irradiation is dependent inter alia on the type of additional particles and the activation temperature. When protons are used as additional particles and when an activation temperature of approximately 400° C., for example in the range of between 350° C. and 450° C., is employed, hydrogen-induced donors are produced in the region into which the protons penetrate during the irradiation, said donors leading to an n-doping of the semiconductor body in this region. The reference symbol 31 in FIG. 1c designates such an n-doped region in the semiconductor body 100 at a distance from the doped semiconductor zone 21. Given identical doses for the implanted dopant particles and protons, however, the doping of the region 31 is substantially lower than the doping of the region 21 if it is assumed that the implanted dopant particles in the region near the surface are completely activated. In the case of a proton implantation and subsequent annealing step, only a few percent of the implanted protons are activated. When protons are used as further particles and at higher activation temperatures, no or only a very small proportion of hydrogen-induced donors remain in the semiconductor body 100. The further particles may, if required, be implanted with two or else a plurality of different energies, thereby resulting in different penetration depths of the further particles.

Figure 2A:
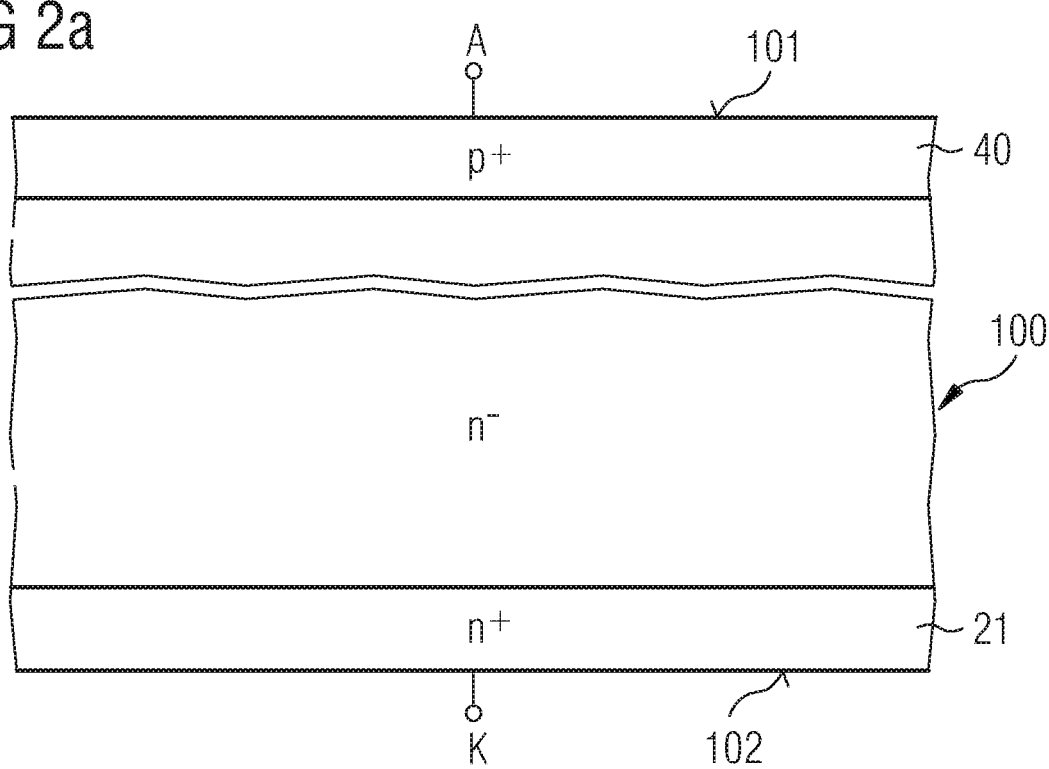
FIG. 2a illustrates a semiconductor component formed as a diode with an emitter zone fabricated by the method according to one embodiment of the invention.

The effectiveness of the method according to one embodiment of the invention has been verified on the basis of experiments with power diodes. FIG. 2a illustrates in side view in cross section, as a partial detail, a vertical power diode with an n-doped emitter 21 fabricated by the method according to one embodiment of the invention, said emitter being arranged in the region of a rear side 102 of the semiconductor body. A p-doped emitter 40 is present in the region of the front side 101 of the semiconductor body. The semiconductor region between the p-type emitter in the region of the front side 101 and the n-type emitter 21 in the region of the rear side 102 forms the n-type base of the power diode, the doping of said n-type base corresponding for example to the basic doping of the semiconductor body 100.

In order to carry out the series of experiments, power diodes in accordance with FIG. 2a were fabricated, the p-type emitters of which were fabricated identically in each case and which differ only by virtue of the fabrication of their n-type emitters. For the fabrication of the n-type emitters, protons were implanted as additional particles besides the implanted dopant particles; the proton dose was varied. The end-of-range region of the proton irradiation carried out for the series of experiments was at a distance of more than 10 µm from the irradiation side in the semiconductor body comprising silicon.

Phosphorus ions were used as dopant particles for the doped semiconductor zone near the surface; the implantation conditions, that is, the implantation dose and the implantation energy, were chosen to be identical for all variants and such that said phosphorus ions penetrated approximately 100-200 nm into the semiconductor body.

FIG. 2b illustrates the forward voltage of the power diodes determined on the basis of experiments as a function of the variable implantation dose of the protons.

The measurement points identified by an x designate the forward voltage of a power diode with an emitter fabricated by the method according to one embodiment of the invention, in the case of which the dopant particles implanted for fabricating the n-type emitter 21 were activated only at an activation temperature of 400° C. The forward voltage of this component decreases with an increasing irradiation dose of the protons additionally implanted into the semiconductor body. While the forward voltage without such proton irradiation is approximately 2.6 V, said forward voltage can be reduced to 2.4 V given a proton dose of $7 \cdot 10^{13}$ cm$^{-2}$, to 2.0 V given an irradiation dose of $2 \cdot 10^{14}$ cm$^{-2}$, and to approximately 1.65 V given an irradiation dose of $1 \cdot 10^{15}$ cm$^{-2}$.

The decreasing forward voltage indicates increasing activation of the implanted dopant particles. An activation of the dopant particles of approximately 100% can be assumed for the forward voltage of 1.65 V since this value for the forward voltage is also achieved in the case of annealing with high temperatures above 750° C. and without additional particle implantation.

Even though some of the protons introduced into the semiconductor body by means of the proton implantation lead to the production of hydrogen-induced donors, this production of hydrogen-induced donors cannot be the cause of the low on-state losses of the power diode, since for the experiments approximately identical implantation doses were chosen for the phosphorus dopant particles and the protons, and since, as is known, merely a few percent of the protons lead to the production of hydrogen-induced donors.

Rather, it must be assumed that the proton irradiation has a catalytic effect on the activation of the implanted phosphorus ions. Irradiation damage produced by the additional proton implantation in the region to be doped possibly facilitates the incorporation of the implanted dopant particles at lattice sites of the crystal lattice, as a result of which lower activation temperatures already suffice to incorporate said implanted dopant particles at lattice sites of the crystal lattice. It is furthermore conceivable that vacancies resulting from the irradiation of the semiconductor body with the additional particles diffuse in the direction of the irradiated surface of the semiconductor body during the thermal step and thus energetically promote the incorporation of the implanted dopant particles at electrically active, substitutional lattice sites of the crystal lattice. Such vacancies may be produced both by proton irradiation but also by irradiation with other particles, for example helium ions, argon ions, semiconductor ions or electrons.

The use of protons might entail a further positive effect that the hydrogen atoms resulting from the protons radiated indiffuse to a great extent in a silicon semiconductor body at temperatures of as low as approximately 400° C. and are suitable for saturating so-called "dangling bonds" that may otherwise lead to a high degree of recombination in the semiconductor body, which is undesirable for the functioning of many semiconductor components since the effectiveness of emitters decreases drastically as a result. If particles other than protons are used as additional particles, this effect may also be achieved by means of an additional indiffusion of hydrogen atoms, for example, from a hydrogen plasma. In this case, the indiffusion of the hydrogen atoms may be effected during the thermal step for activating the dopant atoms at temperatures below 550° C. Furthermore, there is also the possibility of indiffusing hydrogen atoms into the semiconductor body before carrying out the activation thermal step at lower temperatures, for example temperatures in the region of approximately 200° C., from a hydrogen plasma. These already indiffused hydrogen atoms are then indiffused even deeper into the semiconductor body during the subsequent activation step.

The activation step may also be effected in situ by means of the hydrogen plasma treatment, the plasma treatment then expediently being carried out at temperatures of between 250° C. and 550° C., and in one case at approximately 350° C. to 450° C.

The method according to one embodiment of the invention is suitable for fabricating highly doped and highly efficient emitters of vertical power semiconductor components that are fabricated in thin-wafer technology. This is explained below for the fabrication of a highly doped rear side drain terminal of a power MOSFET or of an emitter of a power IGBT with reference to FIG. 3.

FIG. 3a illustrates as a partial detail in cross section a semiconductor body 100' having an n-type basic doping, a cell array for a power MOSFET or a power IGBT being fabricated in the region of the front side 101 of said semiconductor body. Said cell array includes a number of p-doped semiconductor zones 41 in each of which heavily n-doped zones 42 are arranged. A gate electrode 61 is present in a manner insulated by a insulation layer 62 from the semiconductor body 100, which gate electrode, in the example, is arranged above the front side 101 of the semiconductor body and serves in a known manner, during operation of the later component, upon application of a suitable drive potential, for producing a conductive channel in the p-doped semiconductor zones 41 between the heavily n-doped semiconductor zones 42 and the region having the basic doping 50 of the semiconductor body. In the case of a MOSFET or in the case of an IGBT, the p-doped semiconductor zones 41 form the body zone thereof; in the case of a MOSFET or in the case of an IGBT, the n-doped semiconductor zones 42 form the source zone thereof and in the case of a MOSFET or in the case of an IGBT, the region 50 having the basic doping of the semiconductor body forms the drift zone thereof. In the example in accordance with FIG. 3, the gate electrode 61 is arranged above the front side 101 of the semiconductor body 100' and sections of the region 50 having the basic doping extend as far as the front side 101. It goes without saying that it is possible to use any desired further cell geometries for fabricating the power MOSFET or power IGBT, in particular geometries in which the gate electrode extends in a trench into the semiconductor body. Cells having such gate electrodes arranged in a trench are also referred to as trench cells.

A terminal electrode 70 arranged in the region of the front side 101 of the semiconductor body 100', which terminal electrode is arranged in a manner insulated from the gate electrode 61 and makes contact at least with the n-doped semiconductor zone 42, forms a MOSFET's source electrode and an IGBT's so-called "emitter" electrode. When the method according to one embodiment of the invention is used for the fabrication of a rear side emitter or a rear side drain zone of the component, said terminal electrode 70, which includes for example a metal, for example aluminum, can be produced as early as before the fabrication of said semiconductor zone since the method according to one embodiment of the invention requires activation temperatures for the activation of implanted dopant particles that are significantly lower than the melting point or eutectic temperature of conventional metals used for metalization structures. In a manner that is not illustrated, there is also the possibility of fabricating, as early as before the fabrication of the rear side emitter or the rear side drain zone, a plastic passivation layer in the region of the front side of the component, including a polyimide.

For stability reasons, during the method steps for fabricating the cell structure arranged in the region of the front side 101, the semiconductor body may be thicker than is necessary with regard to the desired electrical properties of the later component.

Figure 3B:
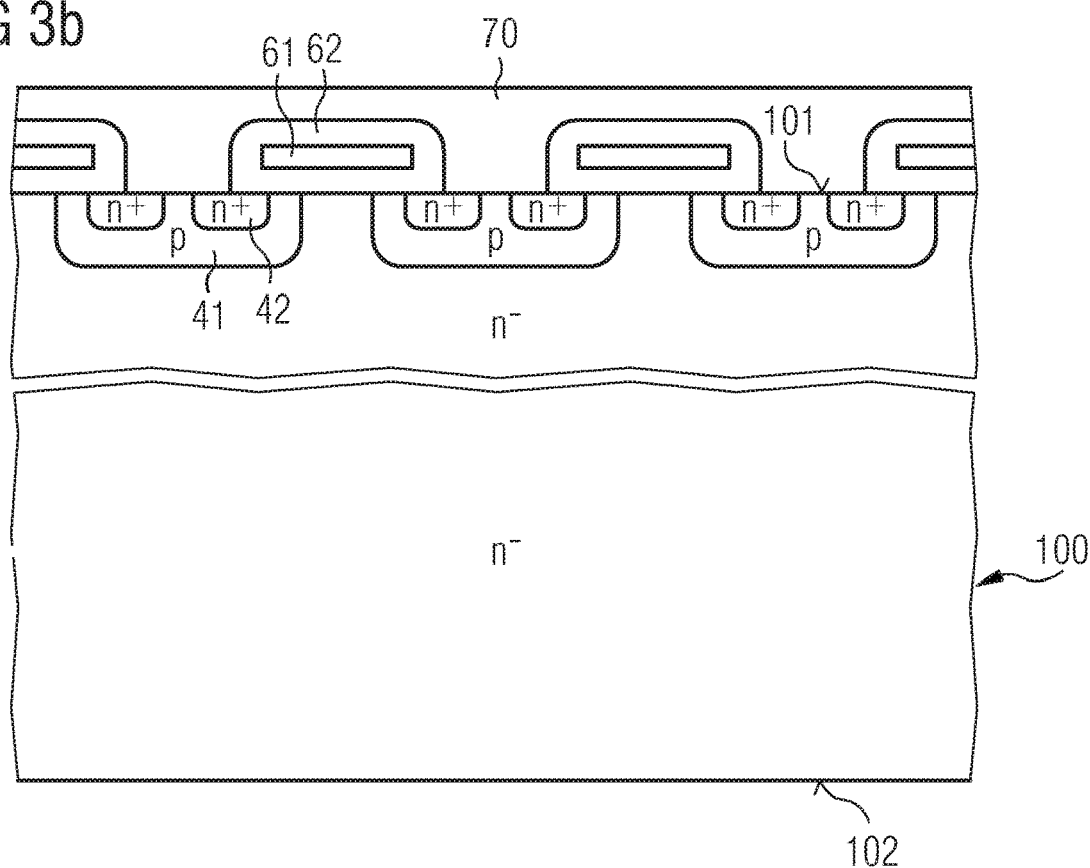

After the fabrication of the component structure in the region of the front side, the semiconductor body is thinned, or reduced in its thickness, to the desired thickness of the later component proceeding from the rear side 102'. This thinning of the semiconductor body is effected for example by grinding, etching or a combination of grinding and etching. The result of this procedure is illustrated in FIG. 3b, with the semiconductor body 100 now having been reduced to the desired thickness required for the electrical properties of the component. Per 100 V of required blocking capability, with silicon as semiconductor material, approximately 10 μm silicon thickness is needed for accommodating the space charge zone in the off-state case. For components with a desired dielectric strength of 600 V, this thickness is consequently approximately 60-70 μm taking account of the penetration depth of the cell region.

This thinning of the semiconductor body 100 is followed by the method according to one embodiment of the invention for fabricating a highly doped emitter or contact in the region of the rear side 102 of the semiconductor body, which method has been explained above with reference to FIG. 1. This region is n-doped for the drain contact of an n-channel power MOSFET and p-doped for the rear side emitter of a power IGBT or the drain contact of a p-channel transistor.

In the case of power IGBTs it is known to arrange a more highly doped field stop zone in the weakly n-doped base 50, which field stop zone serves, in the case of a component effecting blocking, for preventing a punchthrough of the electric field to the rear side emitter. The functioning of such a field stop zone is described for example in DE 102 43 758 A1, already mentioned in the introduction.

For power MOSFETs fabricated according to one embodiment of the method described, use is made of a field stop zone that prevents the punchthrough of the electric field to the rear side n-doped drain contact. Thin doping regions are susceptible to small imperfections in the doping layer which, for example, mask the implantation. Moreover, by way of example, smaller mechanical damage on the rear side of the wafer, caused, for example, by handling of the wafer, or spikes when using aluminum as contact layer with respect to the rear side metalization can penetrate through the n-doped drain contact and, without a field stop situated upstream, would lead at least to undesirably high leakage currents of the MOSFET or even to the failure thereof.

If the fabrication of such a field stop zone in the component is desired, protons are in one case implanted into the semiconductor body as further particles and the temperature during the thermal step subsequent to the implantation step is chosen such that in part hydrogen-induced donors are formed from the implanted protons, said donors forming a field stop zone 31 doped more highly than the drift zone 50 in the semiconductor body 100, which is illustrated as the result in FIG. 3. The distance of this field stop zone 31 can be set by way of the implantation energy of the protons in the manner already explained.

Figure 3C:
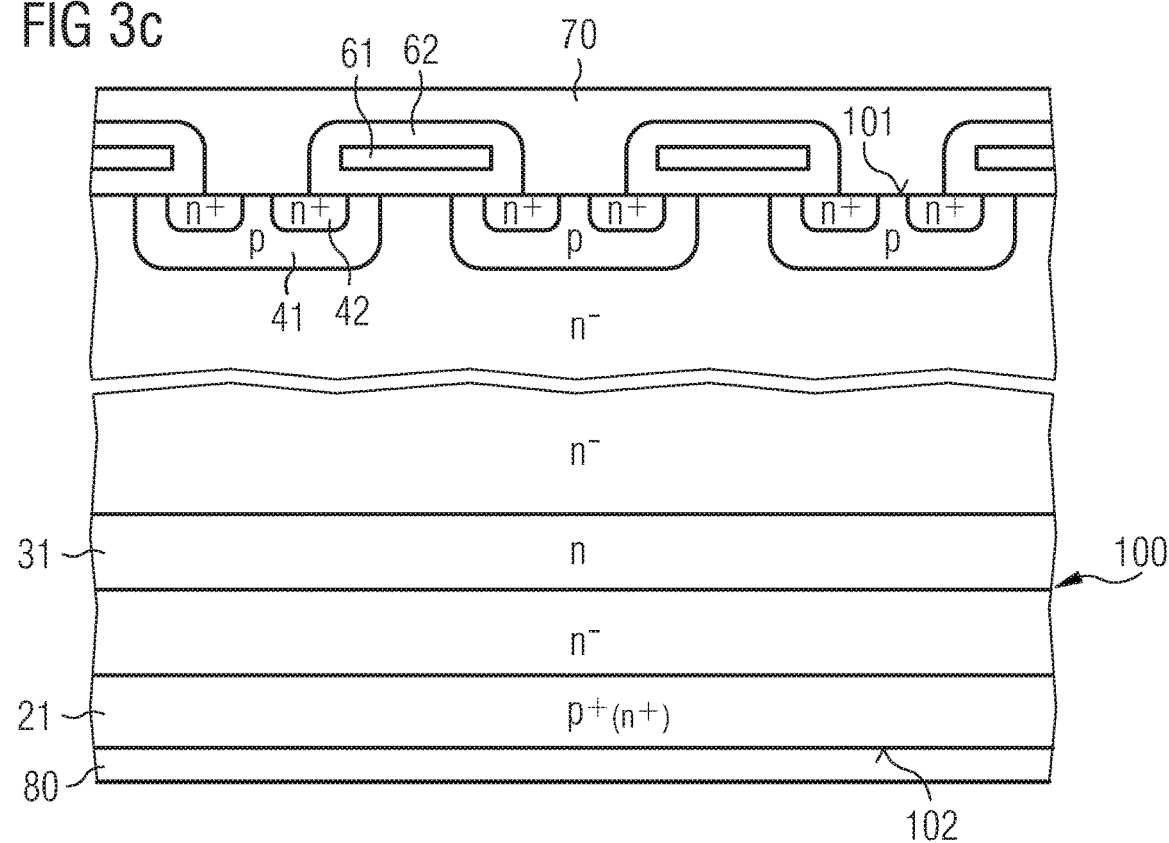

Referring to FIG. 3c, a metalization 80, for example, including a contact layer made of aluminum with subsequent solderable or bondable metal layers, which serves as a terminal electrode, is usually applied to the highly doped semiconductor layer 21 fabricated by means of the method according to the invention.

Said metalization 80 may be applied after the conclusion of the fabrication method for the highly doped semiconductor zone 21. Furthermore, there is also the possibility of applying said metalization 80 after the implantation of the dopant atoms and still before the thermal step is carried out, it being possible for the metalization 80 to be fabricated both before and after the implantation of the further particles. The metalization fabricated before the thermal treatment is carried out can have a positive influence on the recrystallization of the semiconductor body in the region in which the dopant atoms were introduced and in which disturbances of the crystal lattice are present on account of the implantation of the dopant atoms. This phenomenon is known as so-called metal enhanced solid phase epitaxy.

The implantation dose of the dopant atoms introduced into the semiconductor body may be chosen such that the region of the semiconductor body into which the dopant atoms are introduced is at least partially amorphized. If the implantation dose of the doping atoms that is necessary for the electrical doping effect does not suffice therefor, then further, non-doping ions such as, for example, Si, Ge, Ar or Kr may be implanted beforehand, afterward or in situ in order to at least partially amorphize the semiconductor body. Moreover, there is the possibility of introducing the dopant not as an element but rather in the form of a compound such as, for example, $BF_2$ by means of ion implantation and thereby at least partially amorphizing the semiconductor body.

Figure 4A:
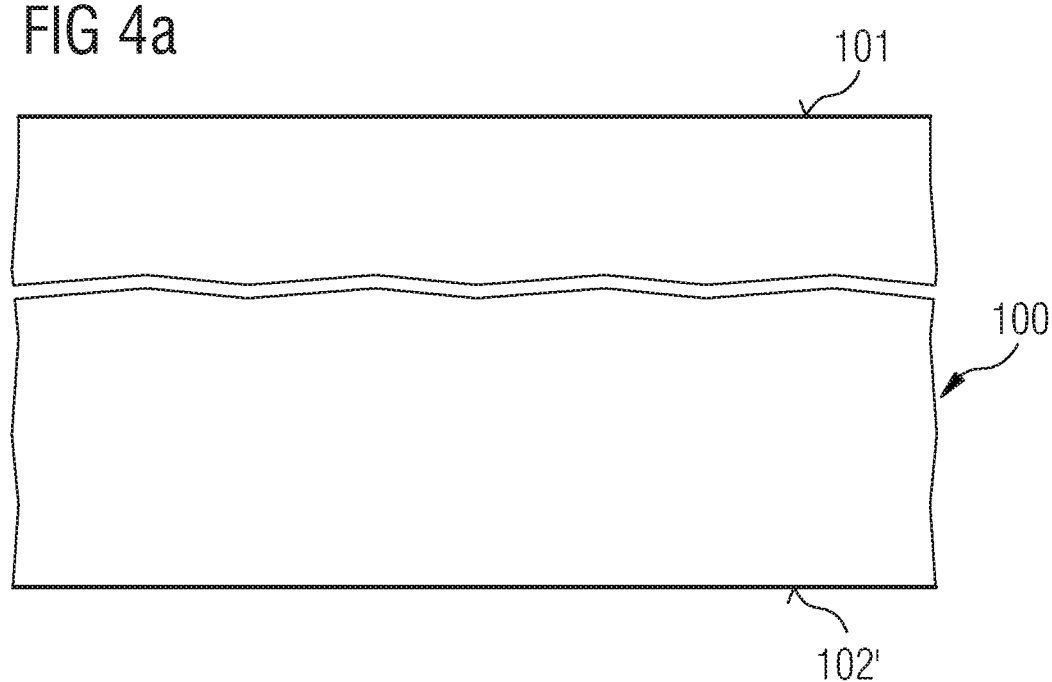
FIGS. 4a-4b illustrate a method for providing a semiconductor body having a layer near the surface that contains dopant particles.
Figure 4B:
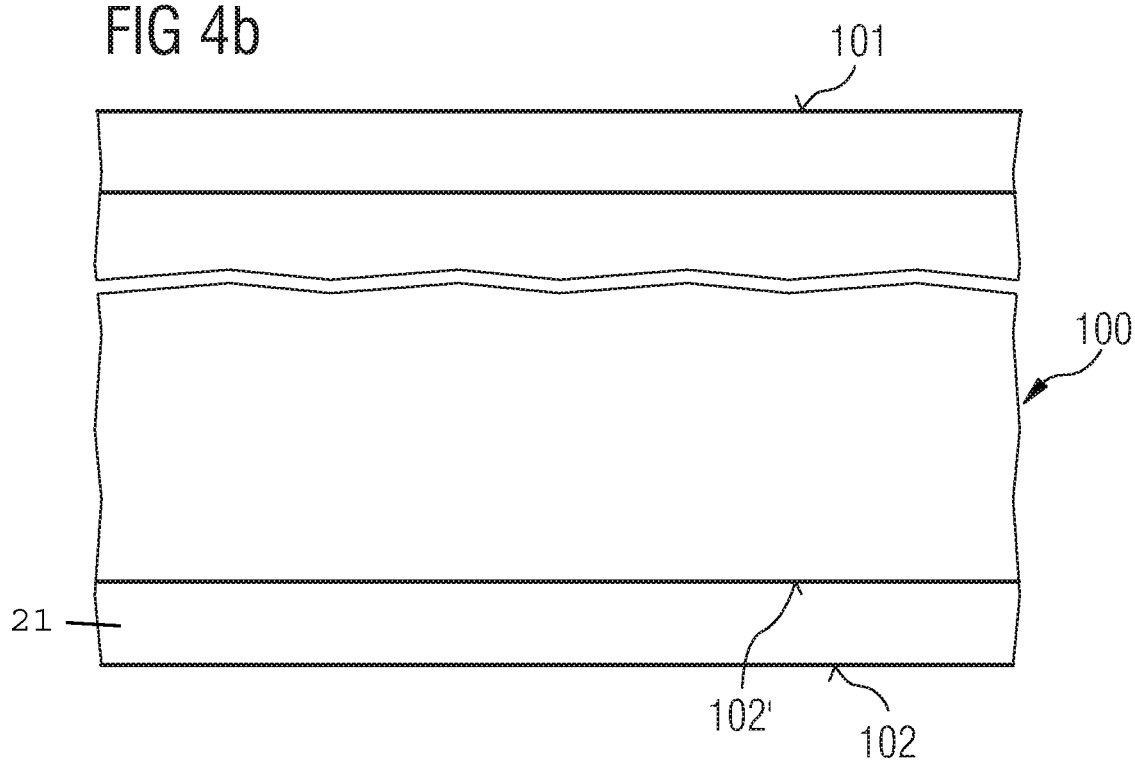

Instead of producing an amorphous semiconductor layer by implantation of dopant atoms, there is also the possibility, referring to FIG. 4 of depositing an amorphous semiconductor layer onto a side 102' of the semiconductor body 100 which either already contains dopant atoms or into which dopant atoms are introduced by means of an implantation method. The result of this method is a semiconductor body 100 with an amorphous semiconductor layer that has dopant atoms and is arranged in the region of one side, which semiconductor body is illustrated in FIG. 4b. The reference symbol 102' in FIG. 4 designates that side of the semiconductor body 100 to which the amorphous layer is applied, and the reference symbol 102 designates that side of the semiconductor body 100 which is formed by the amorphous semiconductor layer 21.

The provision of the amorphous layer containing dopant atoms is followed by the further method steps that have already been explained previously, namely the irradiation of the semiconductor body 100 with further particles and the thermal treatment.

The method according to one embodiment of the invention for fabricating doped semiconductor zones is not restricted to the fabrication of highly doped emitter zones for the power semiconductor components, but rather can be employed in the fabrication of any desired semiconductor zones near the surface. The method is suitable for fabricating semiconductor zones with small penetration depths, as are desirable for example in the fabrication of pn junctions of components in integrated logic circuits. This shall be explained below on the basis of a method for fabricating a lateral transistor of a logic circuit.

FIG. 5a illustrates in side view in cross section a semiconductor body 200, which has an n-type doping, and which has a p-doped semiconductor zone 241 in the region of a front side 201, in which semiconductor zone two n-doped semiconductor zones for the fabrication of a transistor are intended to be produced at a distance from one another.

Referring to FIG. 5b, in order to fabricate said n-doped semiconductor zones, firstly a mask 300 is applied to the front side 201 of the semiconductor body, said mask having cutouts 301 in the regions in which the n-doped zones are intended to be fabricated.

Figure 5C:
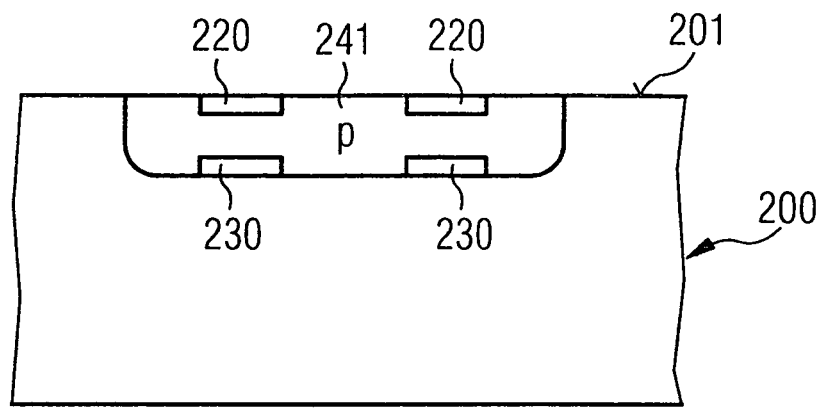

This mask 300 is used to effect an implantation of dopant atoms into the region of the semiconductor body 200 near the surface and furthermore an implantation of further particles, preferably of protons, which are introduced into the semiconductor body 200. The result of these irradiation steps is illustrated in FIG. 5c after removal of the mask 300. In this case, 220 designates the semiconductor zones into which dopant particles were implanted and 230 designates the regions of the semiconductor body in which the further particles, for example protons, were implanted.

Figure 5D:
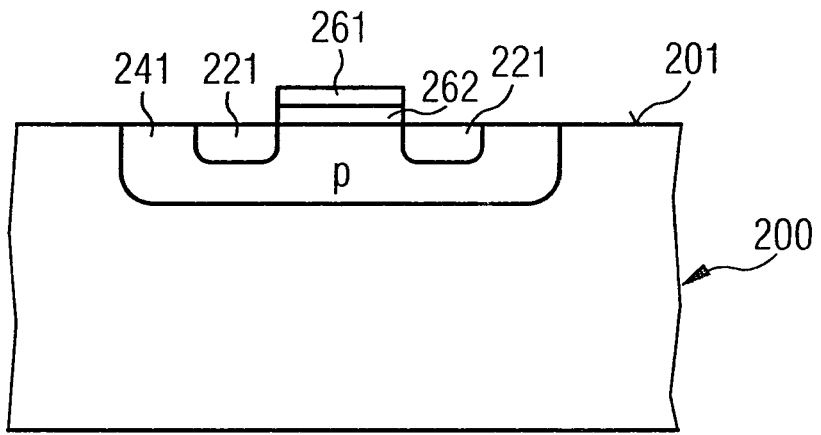

FIG. 5d illustrates the component after carrying out the activation step at temperatures of less than 500° C., which results in n-doped semiconductor zones 221 near the surface which form source and drain zones of the transistor. In order to complete the transistor, a gate electrode 261 is fabricated between the source and drain zones 221, said gate electrode being insulated from the semiconductor body 200 by an insulation layer 262. Said gate electrode may be fabricated after the doping method is carried out or (not illustrated) as early as before the implantation method is carried out, the gate electrode being protected by a section of the mask during the implantation method or itself masking the implantation of the n-doped semiconductor zones 221.

The method according to one embodiment of the invention is suitable for fabricating semiconductor zones with small penetration depths or for fabricating semiconductor zones with a small extent in the vertical and lateral directions, since the temperature during the activation step is low enough to largely avoid diffusion of the implanted dopant atoms into the semiconductor body. With the use of protons or hydrogen as additionally implanted particles, there additionally results, during the activation step of the dopant particles, a saturation of the so-called "dangling bonds" at the interface between the semiconductor body 200 and insulation layers (not specifically illustrated), for example, oxide layers, which are used in logic circuits for example for delimiting individual component structures and for insulating these component structures from further structures.

In contrast to the power semiconductor components explained previously, integrated circuits are not usually fabricated in thin-wafer technology, so that the temperature during the activation thermal treatment can be chosen to be higher provided that metalizations are fabricated only after this thermal treatment. The temperatures may be up to 700° C. in this case; at these higher temperatures, the irradiation dose of the additional particles may be chosen to be lower, if appropriate, than at the temperatures in the range of between 350° C. and 450° as mentioned in connection with the thin-wafer components. However, the temperatures in this case are still significantly lower than activation temperatures in conventional annealing methods after an ion implantation, as a result of which an undesirable indiffusion of the dopant particles is largely avoided.

As has already been explained in connection with FIG. 1, the method according to one embodiment of the invention is also suitable for fabricating a buried semiconductor zone. This is explained below with reference to FIGS. 6a to 6d for the fabrication of a buried semiconductor zone in the body zone of an IGBT or a MOSFET. Such a buried semiconductor zone doped more highly than the body zone serves, in a known manner, for improving the latch-up behavior of an IGBT during normal operation or of a MOSFET in the avalanche mode.

The starting point of the method is formed by the provision of a semiconductor body 400 having a front side 401 and a rear side 402, said semiconductor body having an n-type basic doping in the example. In the region of the front side 401, a first semiconductor zone 441 of a first conduction type is arranged into said semiconductor body 400, a second semiconductor zone 442 of a second conduction type complementary to the first conduction type being arranged in turn in said first semiconductor zone. The first semiconductor zone 441 is p-doped in the example and forms the body zone of the later IGBT or of the later n-channel MOSFET. The second semiconductor zone 442 is n-doped in the example and forms the source zone of an IGBT or of a MOSFET. A region of the semiconductor body 400 that has the basic doping is designated by the reference symbol 443 in FIG. 6a. This region forms the drift path of an IGBT and of a MOSFET. Arranged in the region of the rear side 402 of the semiconductor body 400 is a highly doped semiconductor zone, which is p-doped in the case of an IGBT and which is n-doped in the case of an n-channel MOSFET. This highly doped semiconductor zone 444 forms the p-type emitter of an IGBT and the drain zone of a MOSFET and can be fabricated by means of the method explained with reference to FIG. 1. Said zone 444 may be fabricated before or after the fabrication of the buried doped semiconductor zone that is yet to be explained.

Figure 6A:
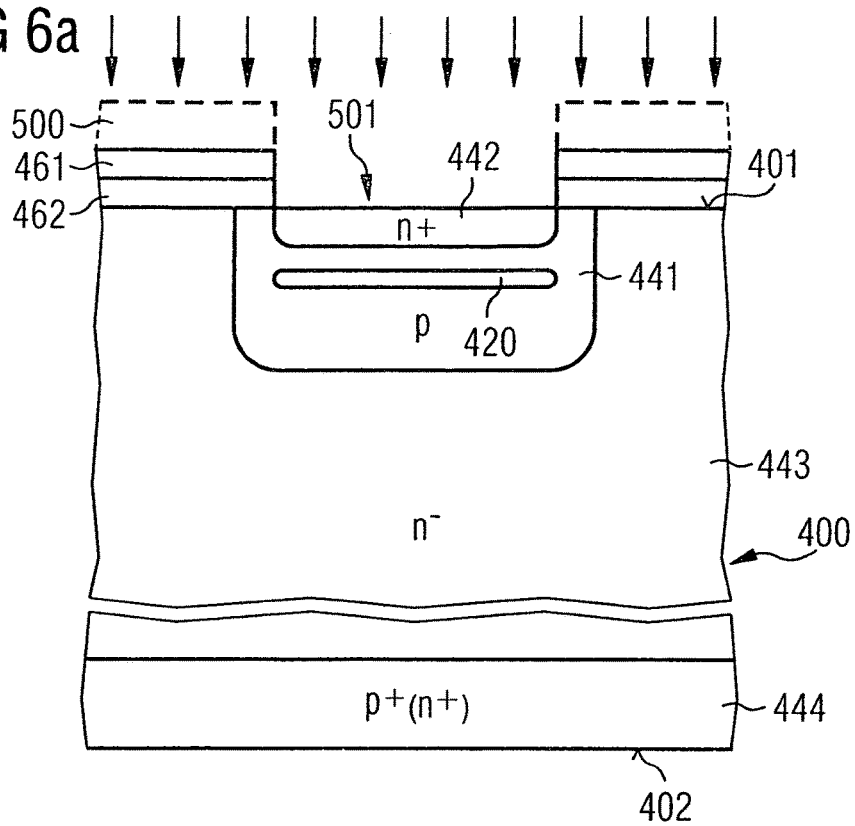
FIGS. 6a-6d illustrate a method for fabricating a buried semiconductor zone in the body zone of an IGBT or a MOSFET with the aim of improving the latch-up behavior.

The fabrication of the structure illustrated in FIG. 6a is effected for example by fundamentally known method steps of a so-called DMOS method. In this method, firstly a first insulation layer 462 is applied to the semiconductor body 400, said insulation layer forming part of the later gate insulation of the component. An electrically conductive layer 461, for example made of polysilicon, is subsequently applied to said insulation layer 462. The layer sequence with the insulation layer 462 and the conductive layer 461 is subsequently patterned using a mask 500—also illustrated in FIG. 6a—and an etching method in such a way that a cutout 501 arises in the layer sequence 461, 462, said cutout reaching as far as the front side 401 of the semiconductor body. Via this cutout 501 in the mask 500 and the layer sequence 461, 462, p-type dopant atoms and n-type dopant atoms are successively introduced into the semiconductor body 400 in order to produce the first and second semiconductor zones 441, 442. As an alternative, there is the possibility of removing the mask 500 prior to the introduction of the dopant atoms and of using only the patterned layer sequence 461, 462 as a mask. The introduced dopant atoms are indiffused into the semiconductor body by the application of thermal methods, the diffusion parameters in this case being chosen such that the first semiconductor zone 441 has a larger extent both in the vertical direction and in the horizontal direction of the semiconductor body 400.

In order to fabricate a buried semiconductor zone in the first semiconductor zone 441, dopant atoms are implanted into the semiconductor body 400 via the cutout 501. In this case, the implantation energy is chosen such that a region 420 into which these dopant particles are implanted is spaced apart from the second semiconductor zone 442 in the vertical direction. Typical vertical distances in this case lie between a few nm and a few 100 nm.

It should be pointed out that the mask 500 for patterning the layer sequence 461, 462 may already have been removed when carrying out this implantation method (and also when carrying out the implantation methods for fabricating the first and second semiconductor zones 441, 442).

The dopant atoms implanted into the first semiconductor zone 441 are of the same conduction type as the first semiconductor zone 441 in order to produce a buried doped semiconductor zone that is of the same conduction type as the first semiconductor zone 441 but doped more highly. In order to fabricate a p-doped semiconductor zone, boron ions, for example, are implanted into the first semiconductor zone 441 during the implantation step.

Figure 6B:
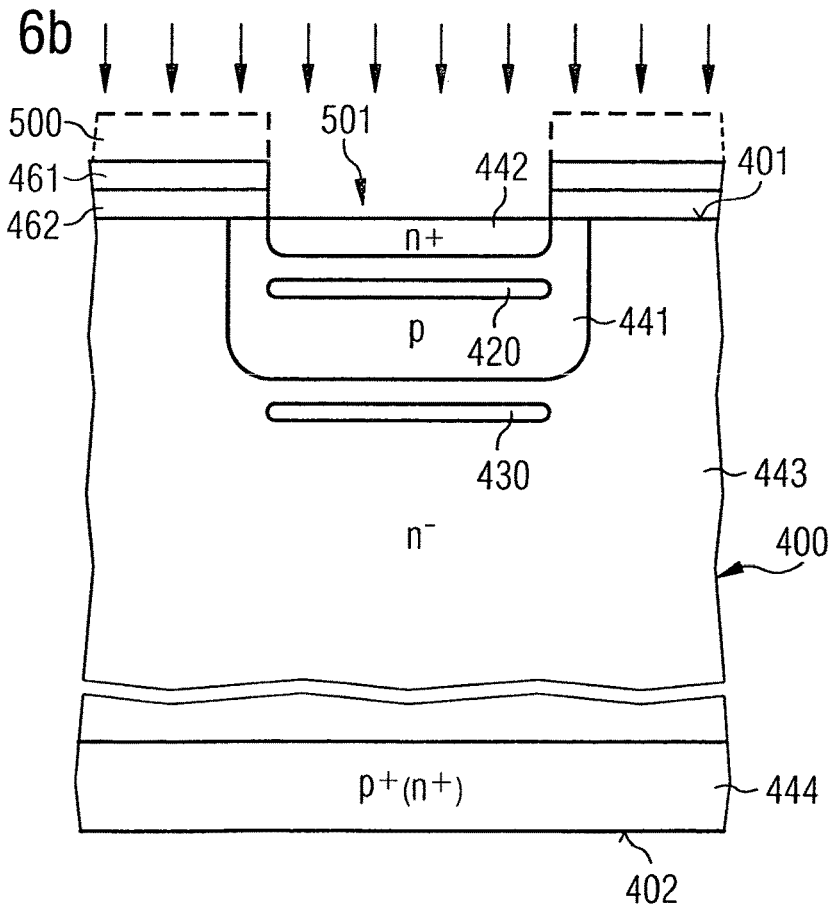

Referring to FIG. 6b, the implantation step explained previously is followed by a method step in which the semiconductor body 400 is irradiated with further particles via the front side 401 in a manner masked using the patterned layer sequence 461, 462 as a mask. Said further particles are protons, for example, but may also be helium ions, argon ions or ions of the semiconductor material used for the semiconductor body 400, ions of a different semiconductor material or else electrons. The end-of-range region, into which the majority of the further particles introduced by the irradiation penetrate into the semiconductor body 400, is designated by the reference symbol 430 in FIG. 6b. Said end-of-range region 430 in one case lies below the region 420 with the implanted dopant atoms in the vertical direction of the semiconductor body, that is to say that the region 430 is spaced apart further from the front side 401 than the region 420 in the vertical direction. In this case, the irradiation energy for the further particles may be chosen such that the end-of-range region 430 still lies within the first semiconductor zone 441 or below said first semiconductor zone 441 in the vertical direction.

When protons are used as further particles, the irradiation energy or implantation energy of said protons typically lies between 100 keV and 2 MeV. A typical dose for this proton irradiation lies in the range of $10^{13}$ cm$^{-2}$ to a few $10^{15}$ cm$^{-2}$.

Figure 6C:
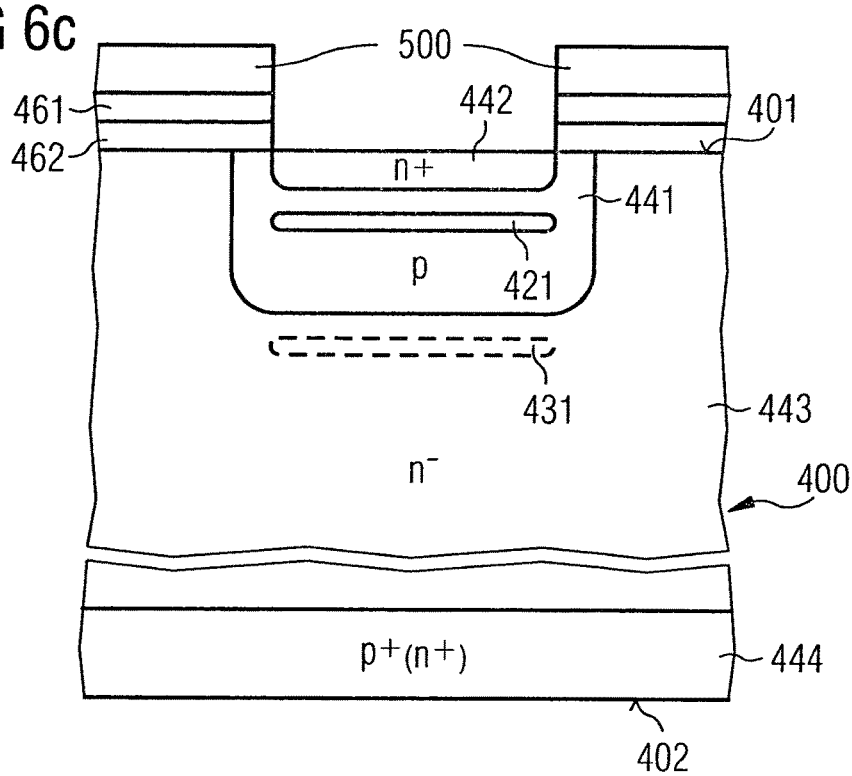

Referring to FIG. 6c, the irradiation step explained previously is followed by an annealing step or activation step during which the semiconductor body 400 is heated to a predetermined activation temperature. This activation energy is less than 550° C. and is in one case approximately 400° C. The duration of this activation step may be between 30 minutes and 24 hours, and in one case lies between 30 minutes and 4 hours for the method for fabricating a buried semiconductor zone as explained with reference to FIG. 6.

As a consequence of this activation step, a buried semiconductor zone 421 doped more heavily than the first semiconductor zone 441 arises in the first semiconductor zone 441 below the second semiconductor zone 442. On account of the low activation temperature, the previously implanted dopant atoms diffuse only to a small extent in the vertical direction of the semiconductor body, so that said dopant atoms do not indiffuse into the second semiconductor zone 442, which would otherwise result in a reduction of the n-doping concentration in the second semiconductor zone 442 and thus in an increase in the electrical resistance of said second semiconductor zone 442, which forms the later n-type emitter or the later source zone.

A diffusion of the p-type dopant atoms in the lateral direction is also largely prevented, as a result of which the dimensions of said buried p-doped zone 421 in the lateral direction remain limited to the dimensions of the cutout (501 in FIGS. 6a and 6b) and thus do not impair the threshold voltage of the component.

With the use of protons as irradiation particles, hydrogen-induced donors may arise in the end-of-range region (430 in FIGS. 6a and 6b). Such a region with hydrogen-induced donors is designated by the reference symbol 431 in FIG. 6c. In the example in accordance with FIG. 6c, said region 431 lies within the region 443 having the n-type basic doping.

The increased doping brought about by the hydrogen-induced donors in the region 431 may have the effect that the avalanche breakdown of the component first occurs at the location of the doping region 431 and not, for instance, at the curvature of the first semiconductor zone 441 or an edge termination (not illustrated) of the transistor.

In one case, an avalanche breakdown directly under the contact to the terminal electrode 464 is preferable to a breakdown site laterally offset with respect thereto, since the holes generated by avalanche multiplication can flow away directly to the contact and do not first have to flow transversely below the layer 442. A high hole current density flowing transversely under the layer 442 might lead to an injection of electrons from the layer 442 by way of the voltage drop generated in the p-type layer 421, since the corresponding pn junction formed from the layer 421 and the layer 442 is forward-biased. As a result, it might happen that the component carries current in an uncontrolled manner. This is referred to as latch-up and might lead to the destruction of the component.

Figure 6D:
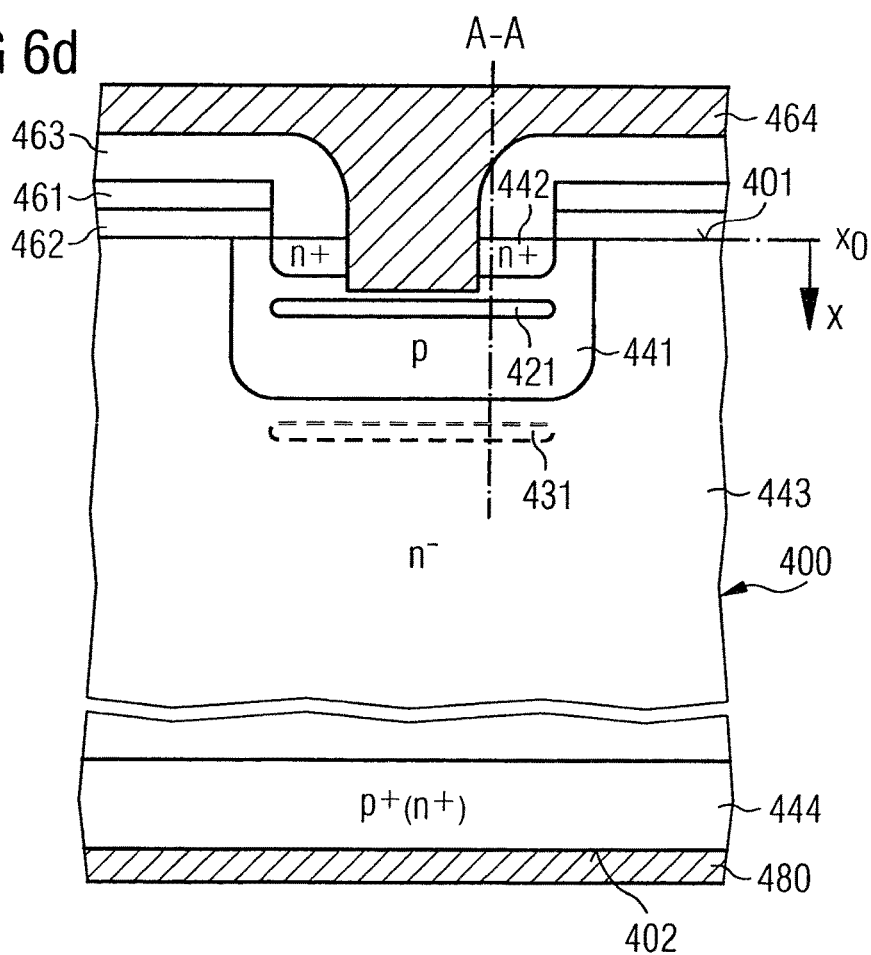

FIG. 6d illustrates the IGBT or MOSFET in cross section after further method steps in which a further insulation layer 463 was applied, which covers the electrically conductive layer 461 on the side remote from the insulation layer 462 and on the sidewalls of the trench (501 in FIGS. 6a and 6c), and in which a terminal electrode 464 was fabricated, which extends in the vertical direction through the second semiconductor zone 442 right into the first semiconductor zone 441 in order that these semiconductor zones 441, 442, which are doped complementarily with respect to one another, are short-circuited with one another.

The result of these method steps explained above is an IGBT or MOSFET having a DMOS structure. An IGBT is present if the highly doped semiconductor zone 444 arranged in the region of the rear side 402 is p-doped, and an n-channel MOSFET is present if the rear-side semiconductor zone 444 is n-doped.

The buried semiconductor zone 421 arranged in the first semiconductor zone 441, which forms the body zone of an IGBT and of an n-channel MOSFET, and doped more highly than the first semiconductor zone 441 serves for reducing the electrical resistance for holes in the p-type base or the body zone 441 and thus serves for improving the latch-up behavior of the component. In the case of an IGBT in which a hole flow is permanently present, said buried semiconductor zone 421 is already beneficial during normal operation. In the case of a MOSFET, said buried semiconductor zone is beneficial only in the avalanche mode or during its commutation after the drift zone 443 has been flooded with charge carriers after the operation of the inverse diode of the MOSFET.

Figure 7:
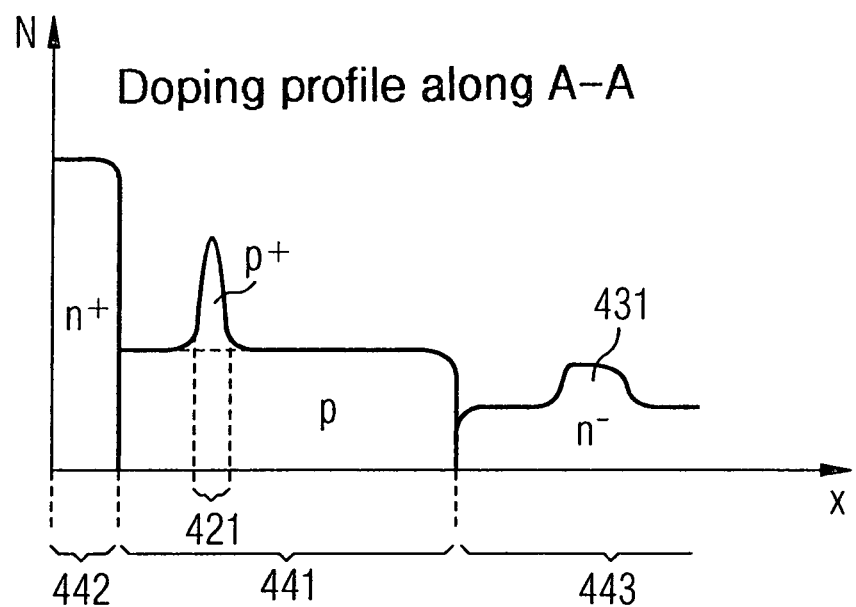
FIG. 7 illustrates the doping profile in the component in accordance with FIG. 6d in a vertical direction of the component.

FIG. 7 illustrates the doping profile in the component in accordance with FIG. 6d in the vertical direction of the component, which is designated as the x direction, proceeding from the front side 401. In order to afford better understanding, FIG. 7 likewise specifies the reference symbols of the respective semiconductor zones through which the line A-A runs and their doping concentrations are illustrated in FIG. 7. As can be seen with reference to FIG. 7, the buried semiconductor zone 421 within the p-type base or body zone 441, in a region at a distance from the n-type emitter or the source zone 442, leads to a significant increase in the doping concentration within a narrow region in the vertical direction. The narrow buried semiconductor zone 421 in the vertical direction of the semiconductor body 400 leads, in particular in the lateral direction, to an increase in the hole conductivity in the direction of the terminal electrode 464 and thus leads to an improvement of the latch-up behavior.

The application of the method according to one embodiment of the invention for fabricating a buried doped semiconductor zone in the p-type base of an IGBT or the body zone of a MOSFET is also suitable for trench components in which the gate electrode is formed in a trench extending in the vertical direction of the semiconductor body.

Figure 8A:
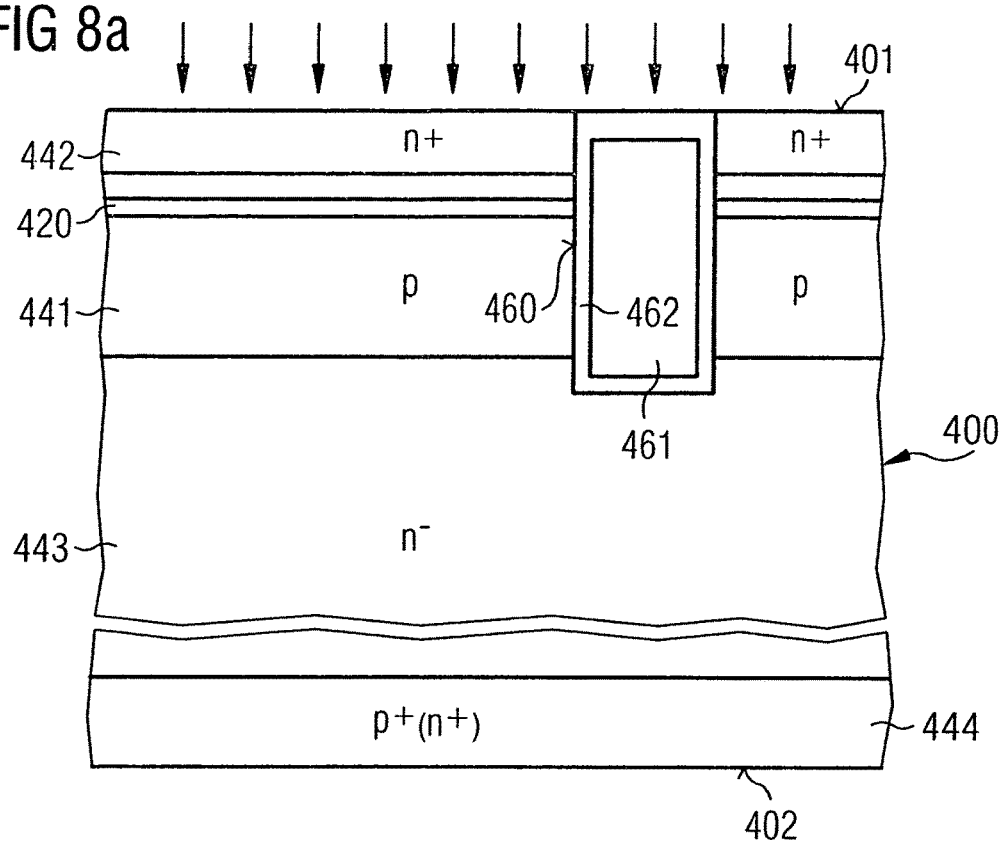
FIGS. 8a-8d illustrate a method for fabricating a buried doped zone in the body zone of a trench IGBT or a trench MOSFET with the aim of improving the latch-up behavior.

FIG. 8a illustrates a component structure for such a trench IGBT or trench MOSFET. This structure differs from that illustrated in FIG. 6a by virtue of the fact that a trench 460 extends into the semiconductor body 400 proceeding from the front side 401, in which trench is arranged a gate electrode 461 insulated from the semiconductor body 400 by a gate insulation layer 462. The first semiconductor zone 441, which forms the body zone of the later IGBT or of the later MOSFET, extends in the lateral direction of the semiconductor body 400 as far as the trench 460. The same applies to the second semiconductor zone 442, which forms the source zone of the later IGBT or of the later MOSFET. In a manner that is not specifically illustrated, a multiplicity of trenches with gate electrodes arranged therein are in one case present which are in each case arranged at a distance from one another in the horizontal direction of the semiconductor body.

The trench 460 with the gate electrode 461 arranged therein extends, proceeding from the front side 401, through the first and second semiconductor zones 441, 442 right into the region 443 having the basic doping of the semiconductor body 400. This region having the basic doping forms the drift zone of the IGBT or of the MOSFET.

In order to fabricate a buried semiconductor zone in the first semiconductor zone 441, provision is made, referring to FIG. 8a, for implanting dopant particles into the semiconductor body 400 via the front side 401. The reference symbol 420 in FIG. 8a designates the region into which said dopant particles are introduced. The dopant particles are of the same conduction type as the first semiconductor zone 441, that is to say are p-doped particles in the example.

Figure 8B:
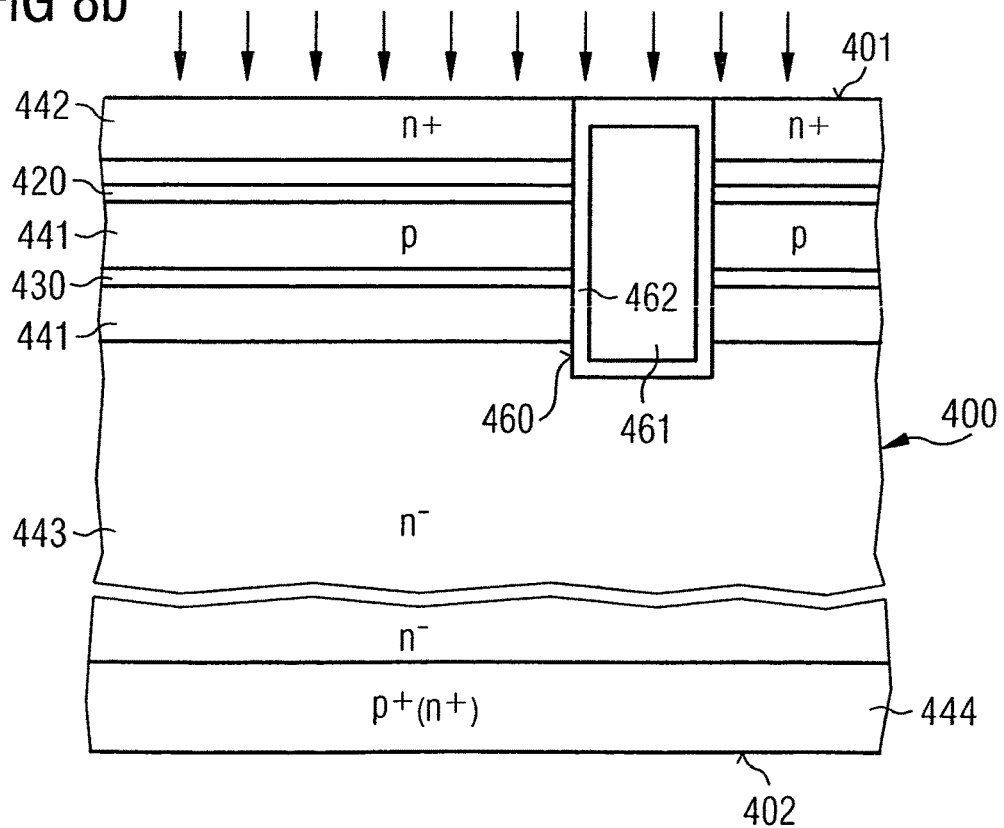

Referring to FIG. 8b, the implantation step explained previously is followed by an irradiation step in which the semiconductor body is irradiated with the further particles via the front side 401. The end-of-range region of this irradiation step is designated by the reference symbol 430 in FIG. 8b. This region 430 lies within the first semiconductor zone 441 in the example, but may also reach right into the drift zone 443.

Figure 8C:
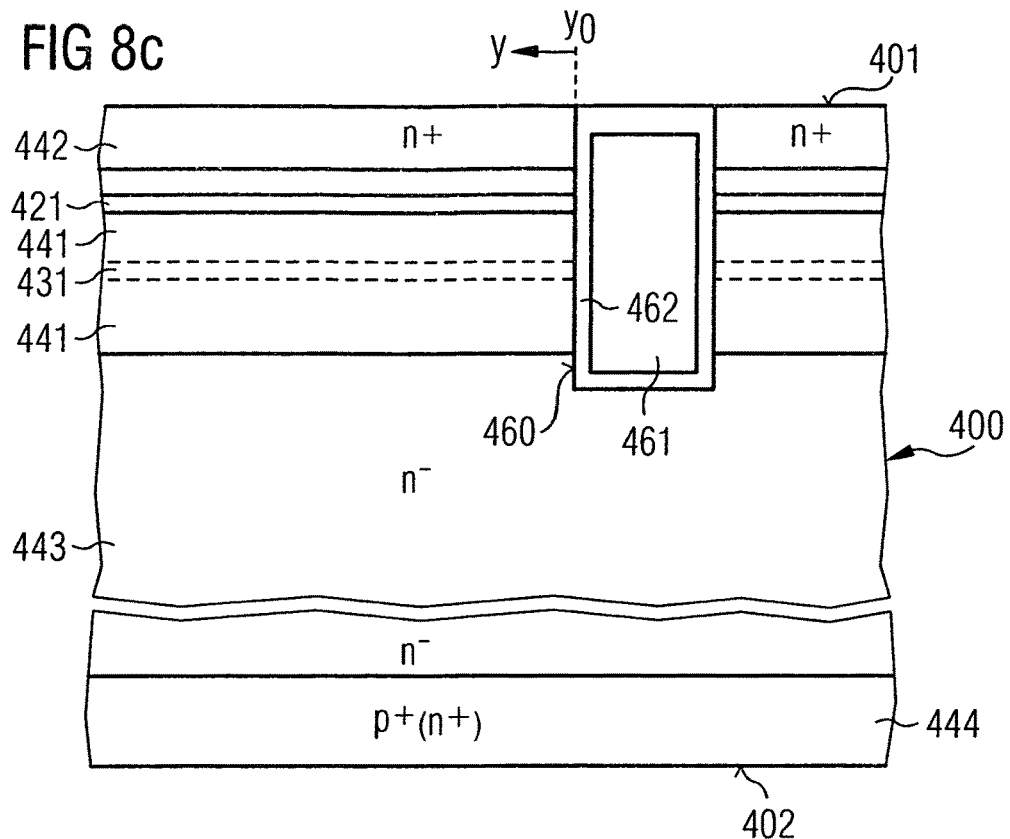

Referring to FIG. 8c, this method step is followed by the activation step, during which the semiconductor body 400 is heated to the activation temperature already explained previously for the time duration already explained previously in order to activate the dopant particles implanted in the region 420 and thereby to produce a buried semiconductor zone 421 below the second semiconductor zone 442 in the semiconductor body 400.

The implantation and irradiation steps explained previously with reference to FIGS. 8a and 8b may be effected without using an additional mask, so that the region 420 with implanted dopant atoms as illustrated in FIGS. 8a and 8b reaches in the lateral direction of the semiconductor body as far as the trench 460. The introduced dopant atoms are not activated uniformly, however, within said region 420, rather the activation rate is lower in the region near the trench 462, with the consequence that the effective doping of the buried semiconductor zone 421 is lower in the vicinity of the trench 460 than in the remaining regions. The lower doping of the buried semiconductor zone 421 in the region of the trench 460 is advantageous because the threshold voltage of the component is thus not influenced, or is influenced only to a small extent, by the additional buried semiconductor zone 421.

The reason for this lower activation of the dopant atoms in the region of the trench 460 is that the vacancies which are produced by the irradiation of the semiconductor body with the additional particles and support the activation of the implanted dopant particles also diffuse in the direction of the trench 460 during the thermal step carried out for the activation. In this case, the trench 460 forms a sink for these vacancies, so that, in a region adjacent to the trench, fewer vacancies diffuse in the direction of the front side 401. It follows from this that, directly adjacent to the trench 460, fewer dopant atoms are activated in the semiconductor zone 421. A "self-aligned" semiconductor zone 421 is obtained as a result in the case of this method, this zone being doped more lightly in the region of the trench 460, as a result of which the threshold voltage of the component is not influenced or is influenced only slightly, but said semiconductor zone being highly doped in the remaining regions in order to improve the latch-up behavior of the component.

Figure 9:
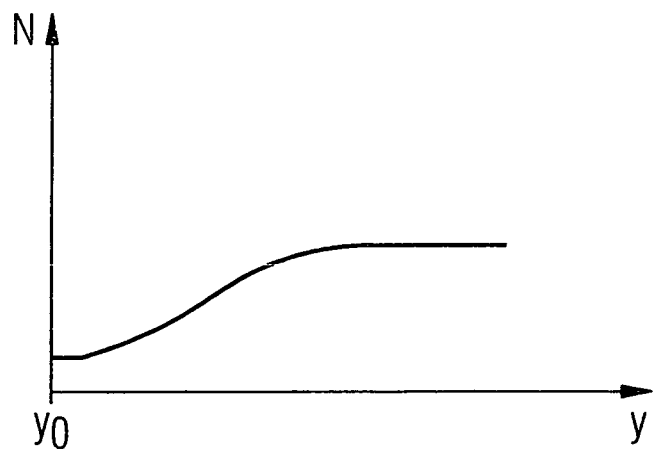
FIG. 9 illustrates the profile of the doping concentration in the doped buried zone in accordance with FIG. 8 in the horizontal direction proceeding from a trench.

FIG. 9 schematically illustrates the doping profile in this buried semiconductor zone 421 in the horizontal direction (y direction) proceeding from the side wall of the trench 460, the position of which corresponds to the position $y_0$ in the illustration in accordance with FIG. 9.

Figure 8D:
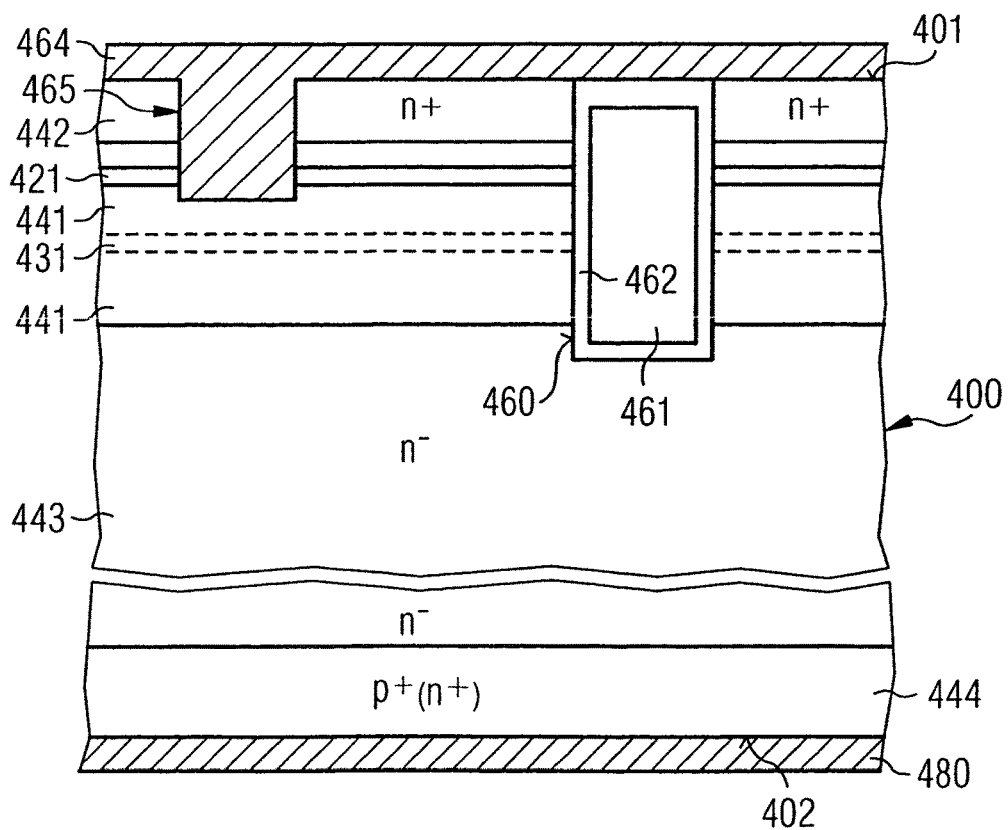

FIG. 8d illustrates the component after the fabrication of further method steps in which terminal electrodes 464, 480 were produced. The terminal electrode 464 extends in sections through the second semiconductor zone 442 and the buried doped semiconductor zone 421 right into the first semiconductor zone 441 in order to short-circuit these semiconductor zones, that is to say source and body in the case of an IGBT or in the case of a MOSFET. Moreover, during these method steps, a terminal electrode 480 is applied to the rear side 402 of the semiconductor body.

It should be noted that the method for fabricating the buried semiconductor zone 421 may be effected as early as prior to the fabrication of the metalization (464 in FIGS. 6 and 8).

The method for fabricating a buried doped semiconductor zone with the aim of improving the latch-up behavior of a MOS transistor has been explained for an IGBT and for an n-channel MOSFET with reference to FIGS. 6 and 8, the buried semiconductor zone in this case being a p-doped semiconductor zone. It should be pointed out that the method explained can, of course, also be applied to the fabrication of an n-doped semiconductor zone in the n-doped body zone of a p-channel MOSFET. In this case, suitable n-type dopant atoms are to be implanted into the n-type body zone of the p-type MOSFET during the implantation step.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming a cell array for a power MOSFET or a power IGBT in a region of a front side of a semiconductor body, the cell array including a plurality of body zones in each of which a source zone of an opposite conductivity is arranged;
    forming a terminal electrode in the region of the front side of the semiconductor body, the terminal electrode making contact at least with the source zones;
    after forming the cell array and the terminal electrode, thinning the semiconductor body from a rear side opposite the front side;
    forming an emitter region at the thinned rear side of the semiconductor body, by implanting dopant particles into the thinned rear side of the semiconductor body;
    irradiating the thinned rear side of the semiconductor body with further particles, wherein an irradiation energy or implantation energy for the further particles is chosen such that the further particles penetrate more deeply into the semiconductor body from the thinned rear side than the dopant particles; and
    after the implanting and the irradiating, annealing the semiconductor body at a temperature less than the melting point or eutectic temperature of a metal used to form the terminal electrode, to activate the emitter region,
    wherein at least irradiation steps with different irradiation energies are carried out for irradiating the thinned rear side of the semiconductor body with the further particles.

2. The method of claim 1, further comprising:
    forming a passivation layer in the region of the front side of the semiconductor body before the annealing of the semiconductor body,
    wherein the temperature of the annealing is less that a decomposition temperature of the passivation layer.

3. The method of claim 2, wherein the passivation layer is a polyimide.

4. The method of claim 1, wherein the further particles are protons and wherein the annealing is performed in a temperature range of between 350° C. and 450° C.

5. The method of claim 1, wherein the semiconductor body is thinned to a thickness in a range of between 10 μm to 70 μm.

6. The method of claim 1, wherein the further particles are protons, and wherein the thinned rear side of the semiconductor body is irradiated at a dose and energy such that in part hydrogen-induced donors are formed from the implanted protons and the hydrogen-induced donors form a field stop zone that is doped more highly than a drift zone in the semiconductor body.

7. The method of claim 1, further comprising:
    applying a metallization to the thinned rear side of the semiconductor body before the annealing of the semiconductor body.

8. The method of claim 7, wherein the metallization is applied to the thinned rear side of the semiconductor body after the implanting of the dopant particles and before the irradiating with the further particles.

9. The method of claim 1, wherein an implantation dose of the dopant particles is chosen such that the region of the semiconductor body into which the dopant particles are introduced is at least partially amorphized.

10. The method of claim 1, further comprising:
    before the irradiating, implanting further, non-doping ions into the thinned rear side of the semiconductor body to at least partially amorphize the semiconductor body.

11. The method of claim 1, further comprising:
    before the irradiating, depositing an amorphous semiconductor layer onto the thinned rear side of the semiconductor body.

12. The method of claim 1, wherein a duration of the annealing is between 30 minutes and 24 hours.

* * * * *

UNITED STATES PATENT AND TRADEMARK OFFICE
CERTIFICATE OF CORRECTION

PATENT NO. : 10,651,037 B2
APPLICATION NO. : 11/232735
DATED : May 12, 2020
INVENTOR(S) : Schulze et al.

It is certified that error appears in the above-identified patent and that said Letters Patent is hereby corrected as shown below:

On the Title Page

References Cited, U.S. Patent Documents, Column 2, Line 3, please add --6,475,887 * 11/2002 Kawasaki et al.--

Page 2, References Cited, Column 2, Line 12, please delete the duplicate reference "DO 220 812 4/1985"

Page 2, References Cited, Other Publications, Column 2, Line 20, please delete the duplicate reference "Baliga, Jayant B., "Power Semiconductor Devices," PWS Publishing, Chapter 8: Insulated Gate Bipolar Transistor, pp. 453-457, (1995)."

Signed and Sealed this
Eleventh Day of August, 2020

Andrei Iancu
*Director of the United States Patent and Trademark Office*